(12) United States Patent
Menkhoff et al.

(10) Patent No.: US 11,394,412 B2
(45) Date of Patent: Jul. 19, 2022

(54) PREDISTORTION CIRCUIT, METHOD FOR GENERATING A PREDISTORTED BASEBAND SIGNAL, CONTROL CIRCUIT FOR A PREDISTORTION CIRCUIT, METHOD TO DETERMINE PARAMETERS FOR A PREDISTORTION CIRCUIT, AND APPARATUS AND METHOD FOR PREDISTORTING A BASEBAND SIGNAL

(71) Applicant: Apple Inc., Cupertino, CA (US)

(72) Inventors: Andreas Menkhoff, Oberhaching (DE); Gunther Kraut, Egmating (DE); Andreas Langer, Unterschleissheim (DE)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/766,416

(22) PCT Filed: Dec. 29, 2017

(86) PCT No.: PCT/US2017/068859
§ 371 (c)(1),
(2) Date: May 22, 2020

(87) PCT Pub. No.: WO2019/132949
PCT Pub. Date: Jul. 4, 2019

(65) Prior Publication Data
US 2020/0382147 A1    Dec. 3, 2020

(51) Int. Cl.
*H04B 1/04* (2006.01)

(52) U.S. Cl.
CPC ... *H04B 1/0475* (2013.01); *H04B 2001/0425* (2013.01)

(58) Field of Classification Search
CPC .......... H04B 1/0475; H04B 2001/0425; H04L 27/368; H03F 1/3247; H03F 3/24
See application file for complete search history.

(56) References Cited

U.S. PATENT DOCUMENTS

| 8,428,525 | B2 | 4/2013 | Bai | |
|---|---|---|---|---|
| 2002/0190787 | A1 | 12/2002 | Kim et al. | |
| 2008/0285640 | A1* | 11/2008 | McCallister | H04L 25/03343 375/233 |

(Continued)

FOREIGN PATENT DOCUMENTS

| EP | 2178205 A1 | 4/2010 |
|---|---|---|
| EP | 2938034 A1 | 10/2015 |

(Continued)

OTHER PUBLICATIONS

International Search Report and Written Opinion for PCT/US2017/068859, dated Oct. 16, 2018, 8 pgs.

(Continued)

*Primary Examiner* — David B Lugo
(74) *Attorney, Agent, or Firm* — Kowert, Hood, Munyon, Rankin & Goetzel, P.C.

(57) ABSTRACT

A predistortion circuit for a wireless transmitter includes a signal input configured to receive a baseband signal. Further, the predistortion circuit includes a predistorter configured to generate a predistorted baseband signal using the baseband signal and a select of one of a first predistorter configuration and a second predistorter configuration.

20 Claims, 18 Drawing Sheets

(56) References Cited

U.S. PATENT DOCUMENTS

| | | | |
|---|---|---|---|
| 2010/0048149 A1 | 2/2010 | Tang et al. | |
| 2012/0200355 A1 | 8/2012 | Neil et al. | |
| 2012/0286863 A1* | 11/2012 | Gandhi | H03F 1/0288 |
| | | | 330/149 |
| 2017/0041804 A1* | 2/2017 | Goedken | H04W 52/367 |
| 2017/0353163 A1* | 12/2017 | Gazneli | H03F 1/3247 |

FOREIGN PATENT DOCUMENTS

| | | |
|---|---|---|
| KR | 100837243 B1 | 6/2008 |
| WO | 2006125398 A1 | 11/2006 |

OTHER PUBLICATIONS

Extended European Search Report for EP Application No. 17936805.5, dated Jun. 11, 2021, 15 pgs.

Liu Youjiang et al: "Concurrent Dual-Band Digital Predistortion With a Single Feedback Loop", IEEE Transactions on Microwave Theory and Techniques, Plenum, USA, vol. 63, No. 5, May 1, 2015 (May 1, 2015), pp. 1556-1568, XP011580127, 13 pgs.

* cited by examiner

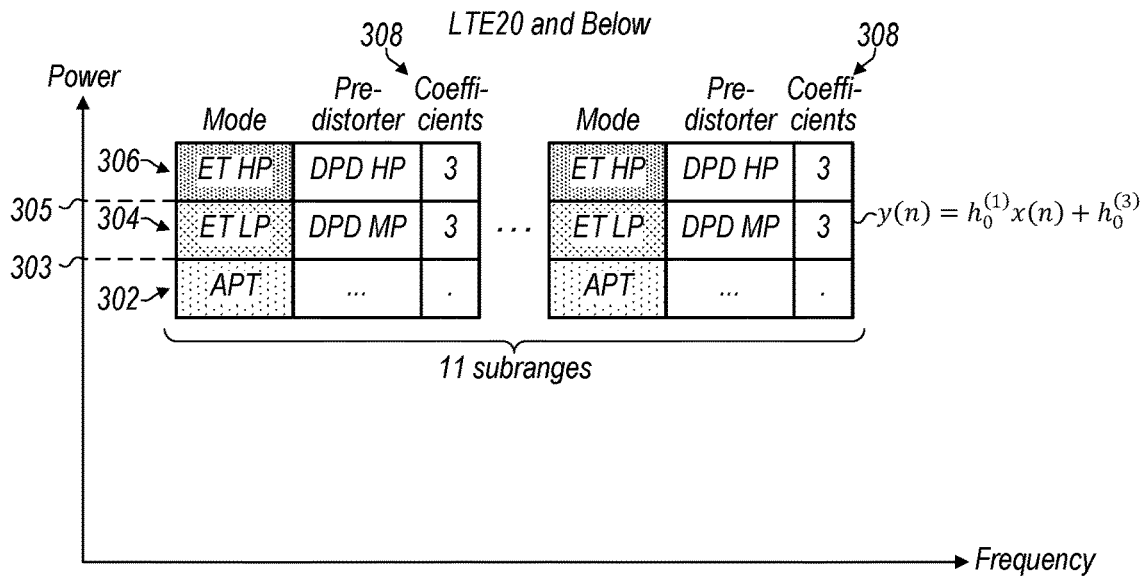
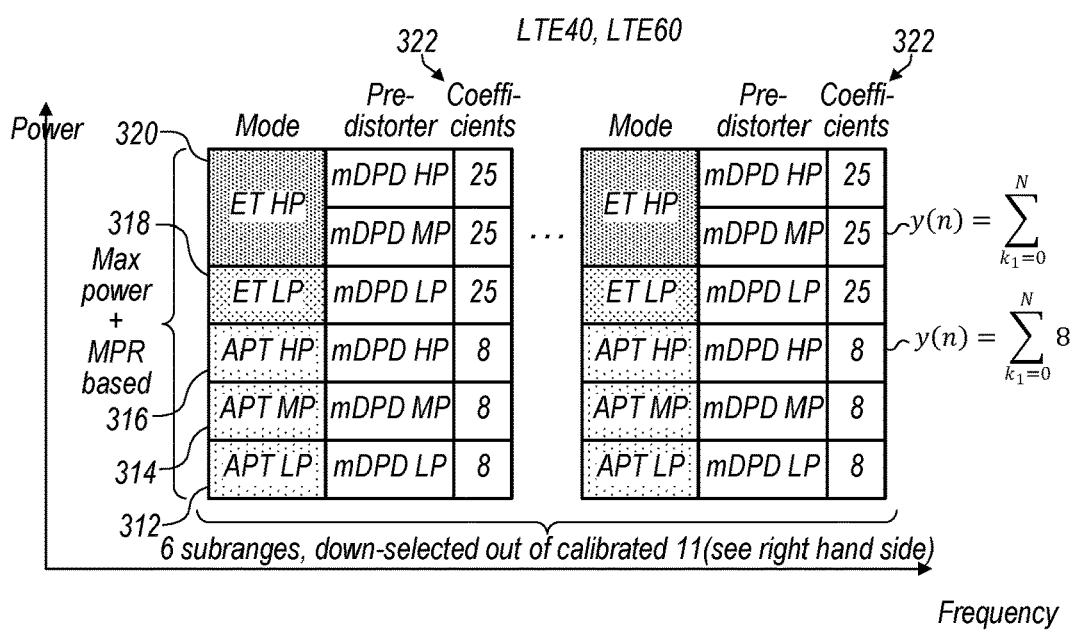
FIG. 3
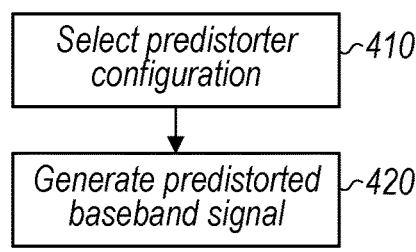
FIG. 4

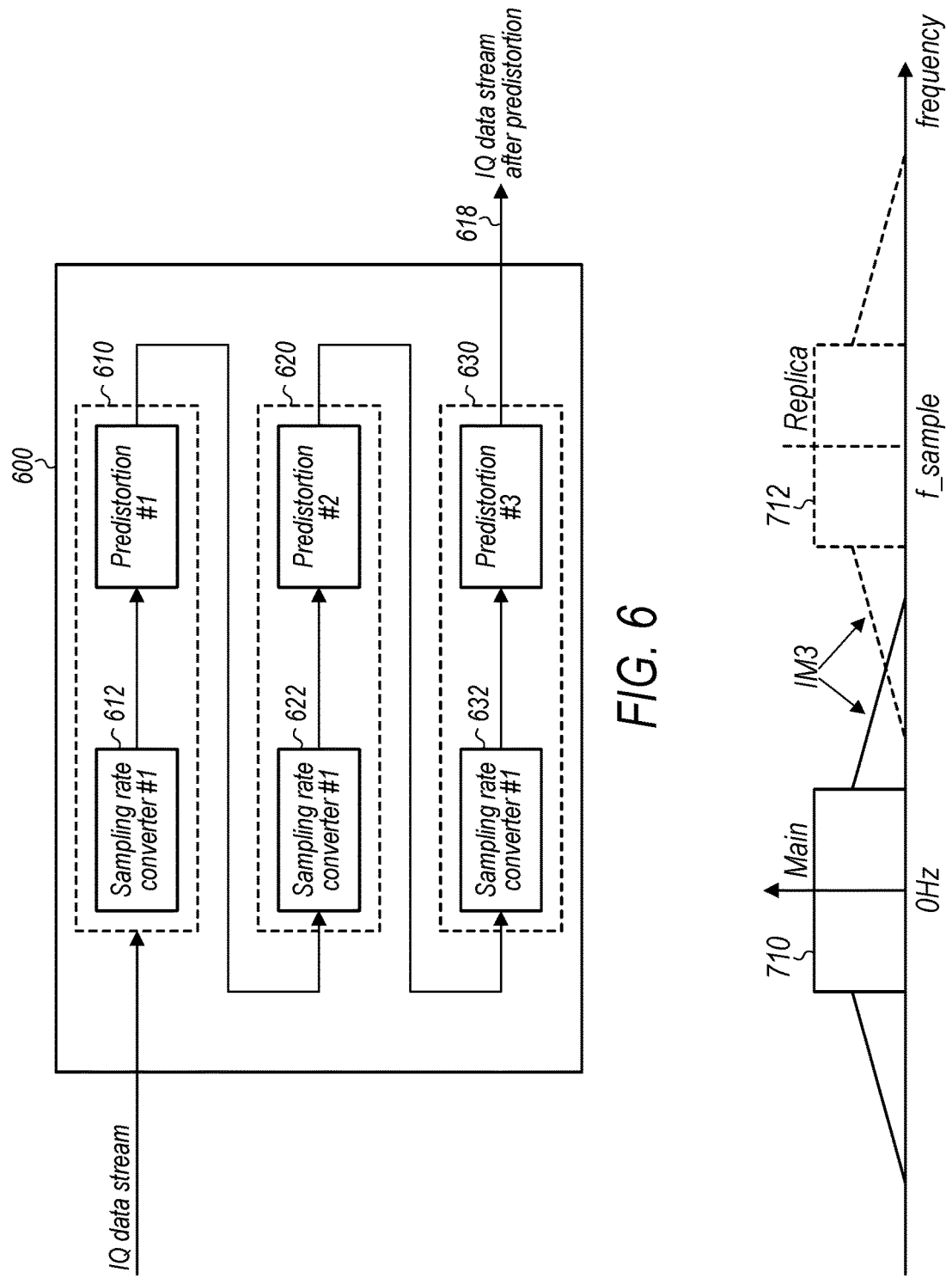

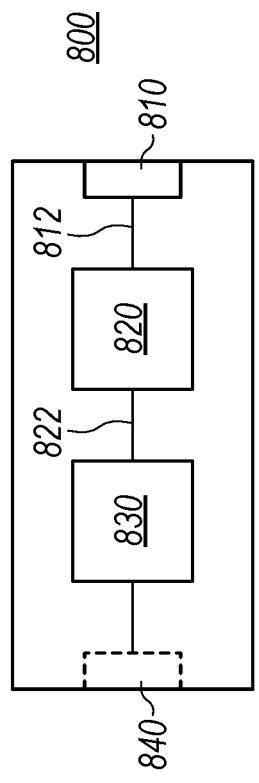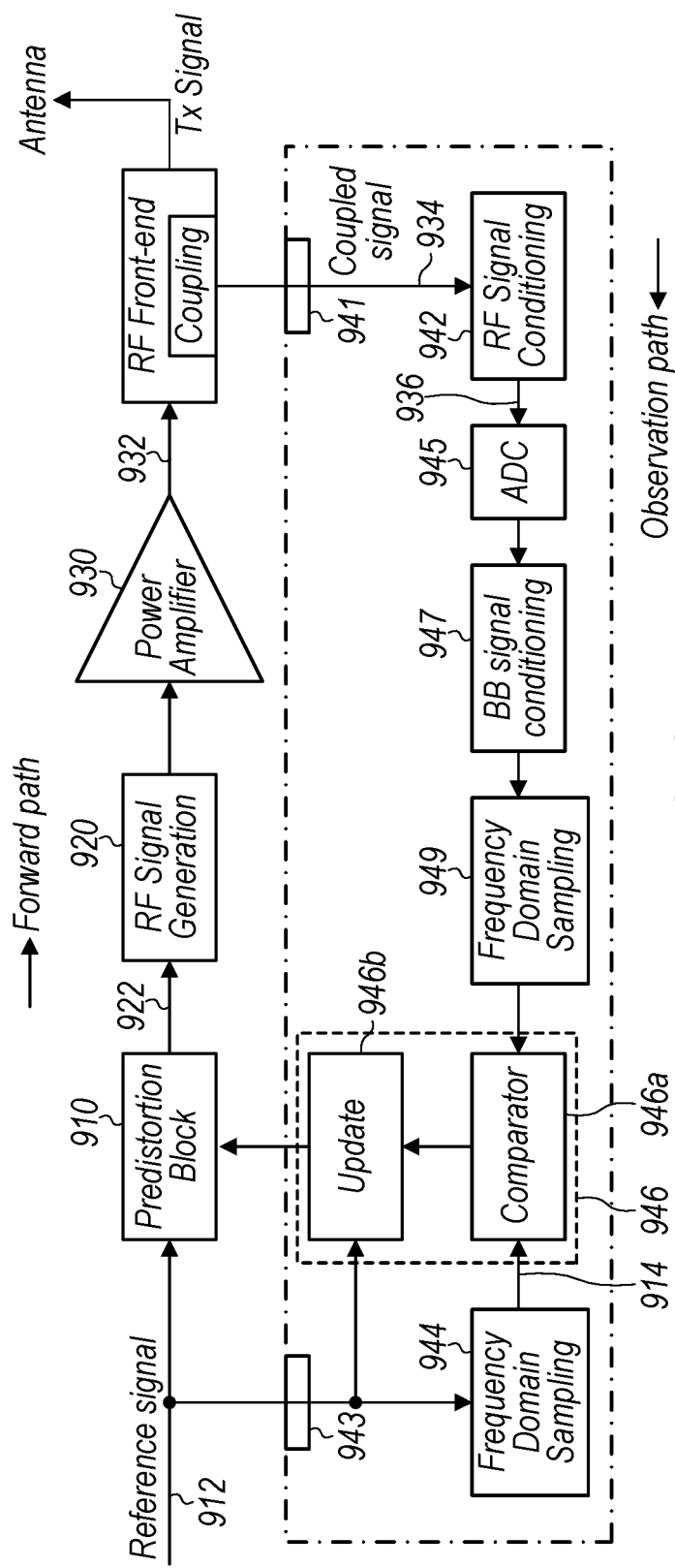
FIG. 8
FIG. 9

$$y(n) = h_1 * x(n) + h_2 * x(n-1) + h_3 * x(n-1)^2 * x(n-1)^* + \ldots + h_K * |x(n-1)|^4 * x(n-4)$$

*Example of a polynomial representation*

$$\begin{bmatrix} x(n) & x(n-1) & x(n-1)^2 x(n-1)^* & \cdots & |x(n-1)|^4 x(n-4) \\ \vdots & \vdots & \vdots & & \vdots \\ x(n+i) & x(n+i-1) & x(n+i-1)^2 x(n+i-1)^* & \cdots & |x(n+i-1)|^4 x(n+i-4) \\ \vdots & \vdots & \vdots & & \vdots \end{bmatrix} * \begin{bmatrix} h_1 \\ h_2 \\ h_3 \\ \vdots \\ h_K \end{bmatrix} = \begin{bmatrix} b_1 \\ b_2 \\ b_3 \\ \vdots \\ b_M \end{bmatrix}$$

$$A * h = b$$

Matrix A: Reference data is used to calculate polynomials, each element reflects one Volterra kernel
- Number of columns: K(=number of coefficients)
- Number of rows: M(=number of data points)
Vector h: Includes model coefficients that shall be determined; K is number of coefficients
Vector b: measure data, M is number of data points

*FIG. 15*

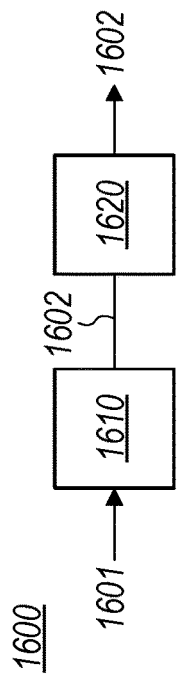

*FIG. 16*

PREDISTORTION CIRCUIT, METHOD FOR GENERATING A PREDISTORTED BASEBAND SIGNAL, CONTROL CIRCUIT FOR A PREDISTORTION CIRCUIT, METHOD TO DETERMINE PARAMETERS FOR A PREDISTORTION CIRCUIT, AND APPARATUS AND METHOD FOR PREDISTORTING A BASEBAND SIGNAL

FIELD

The present disclosure relates to predistortion circuits for wireless transmitters and to control circuits for the predistortion circuits.

BRIEF DESCRIPTION OF THE FIGURES

Some examples of apparatuses and/or methods will be described in the following by way of example only, and with reference to the accompanying figures, in which

FIG. 3 illustrates an example for operation characteristics that may be used to select between at least two predistorter characteristics;

FIG. 4 illustrates a flowchart of an example of a method for generating a predistorted baseband signal;

FIG. 6 illustrates a further example of a predistortion circuit having computation nodes operating at different rates;

FIG. 7 illustrates aliasing deteriorations of a predistorted baseband signal which may be mitigated by an example of a predistortion circuit;

FIG. 8 illustrates an example of a control circuit;

FIG. 9 illustrates an example of a control circuit within a transmitter;

FIG. 15 illustrates a system of system of equations to be optimized to determine predistorter parameters;

FIG. 16 illustrates an example of an apparatus for pre-distorting a baseband signal;

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B. An alternative wording for the same combinations is "at least one of A and B". The same applies for combinations of more than 2 Elements.

The terminology used herein for the purpose of describing particular examples is not intended to be limiting for further examples. Whenever a singular form such as "a," "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises," "comprising," "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
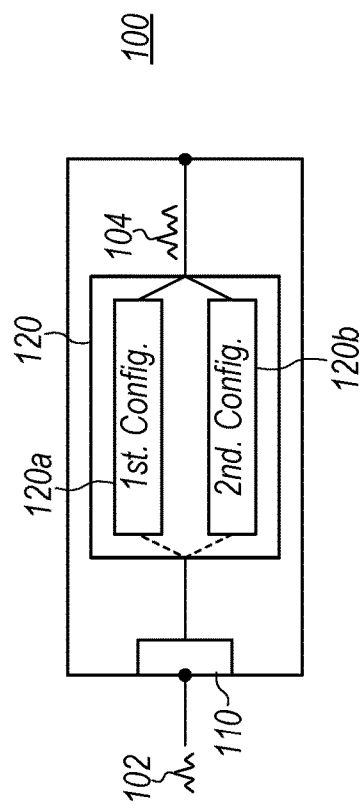
FIG. 1 illustrates an example of a predistortion circuit for a wireless transmitter.

FIG. 1 schematically illustrates an example of a predistortion circuit 100 for a wireless transmitter. The predistortion circuit 100 comprises a signal input 110 configured to receive a baseband signal 102. A predistorter 120 is configured to generate a predistorted baseband signal 104 using the baseband signal 102 and a select of a first predistorter configuration 120a or a second predistorter configuration 120b.

Predistortion can serve to linearize the output of a power amplifier used to amplify a wireless signal before transmission. Power amplifiers of wireless transmitters introduce nonlinearities depending on the baseband signal to be amplified and on further operation characteristics of the power amplifier. For example, if the power amplifier is operated in saturation (in envelope tracking, ET), it tends to show more nonlinearities than in an operation mode where it is not operated in saturation (using average power tracking, APT). A predistortion circuit performs a predistortion function on the baseband signal to alter the baseband signal such that the non-linearities of the power amplifier are anticipated and pre-compensated. If the predistortion function worked perfect, the baseband signal would be transformed into a pre-distorted baseband signal such that an output of a power amplifier used to amplify a wireless transmit signal which is based on the baseband signal (e.g. a radio frequency signal generated by up-mixing the pre-distorted baseband signal) is not deteriorated by the nonlinearities of the power amplifier. In other words, the nonlinearities of the power amplifier are anticipated and inversely superimposed on the baseband signal, to result with an amplified radiofrequency signal having the desired signal characteristics and the desired signal quality. In other words, to linearize the signal at the PA output, a predistortion circuit needs to create an IM spectrum that cancels the IM spectrum of the PA at its output.

Examples of predistortion circuits allow choosing between at least two predistorter configurations to generate the pre-distorted baseband signal, while the predistorter functions corresponding to the predistorter configurations may have different complexity.

In a first predistorter configuration 120a, the predistortion circuit 100 performs a first predistortion function and in the second predistorter configuration 120b it performs a second predistortion function. The predistortion functions are used to modify the baseband signal and to generate the predistorted baseband signal.

A complexity of a predistorter configuration or of the predistortion function performed within the configuration is for instance given by the number of multipliers and/or adders, or generally by the number of computation nodes used within the presently chosen predistorter configuration to perform the predistortion function. A computation node within a predistorter may be a hardware entity or a software portion that performs a single fundamental computation like, e.g., an addition or a multiplication. Consequently, a more complex predistortion function has more computation nodes than a simpler one.

The complexity of a required predistortion function is, for example, driven by the transmit bandwidth and the memory contribution of the transmit chain. For example, a higher number of multipliers may be required for wideband linearization if the transmit bandwidth is higher. The same applies for memory contribution. If the transmit chain includes strong memory effects (e.g. due to ET operation, particularly at the band edge where the filter skirt kicks in) then the complexity of the predistortion function required may further increase leading to further increase in the number of multipliers/computation nodes may further increase.

In the event of complex models, predistortion might, on the other hand, have a significant impact on current consumption KPIs (key performance indicators). For example, the number of multipliers may determine the current consumption of the predistortion circuitry. In a conventional approach, the complexity of the predistorter configuration is driven by the worst case waveform supported by the transmitter (e.g. maximum transmit bandwidth, constellation density, peak-to-average power ratio), the worst case memory contribution of TX chain, required linearization bandwidth, etc. so that a single predistorter configuration suites all possible scenarios. However, for less complex waveforms supported by the wireless transmitter, a predistorter configuration with lower complexity might be good enough to achieve the linearity performance or signal quality requirement as defined, e.g. by ACLR and EVM.

According to the example illustrated in FIG. 1, the predistorter is configured to use one of the at least two configurations that may allow to use a configuration consuming less power for a given operation characteristic while at the same time fulfilling all signal quality requirements. If a simpler configuration of the predistortion circuit is sufficient for the given waveform to be amplified (depending on the present operation characteristics of the wireless transmit circuit) then such simpler configuration may be chosen so as to save or conserve energy. The predistortion function nonetheless generates a predistorted baseband signal fulfilling all signal quality requirements.

According to some examples, a first number of computation nodes is active in the first predistorter configuration and a second number of computation nodes are active in the second predistorter configuration. Assuming that the second predistorter configuration is more complex, the second number of computation nodes may be higher than the first number. If a simpler configuration of the predistorter is sufficient to amplify the waveform of the baseband signal (e.g. first predistorter configuration may be a simpler configuration than the second predistorter configuration) then the predistorter circuit 120 may be capable of switching from the second predistorter configuration to the first predistorter configuration. Such flexibility to switch to the simpler configuration of the predistorter (e.g., first predistorter 120 a here) allows the energy to be saved since the first predistorter configuration requires less computation nodes to generate the predistorted baseband signal.

Present mobile devices, already, support many different modulation schemes starting from relatively simple 3G voice signals up to more complex waveforms of, e.g., LTE-60 with 256 QAM. The introduction of 5G NR and the up-coming enhancements of the LTE standard will further increase the spread between the "simplest", least complex waveform and the most complex waveform. Therefore, an unnecessary power consumption of a conventional predistorter, which is designed to support the worst case or most complex waveform is likely to increase with future standards. In a conventional approach, the current consumption of the predistortion block or circuit would be unnecessarily high for a lot of the supported waveforms (e.g. LTE signals with low RB allocation) which would waste battery current and degrade the results in critical KPI tests.

Figure 2:
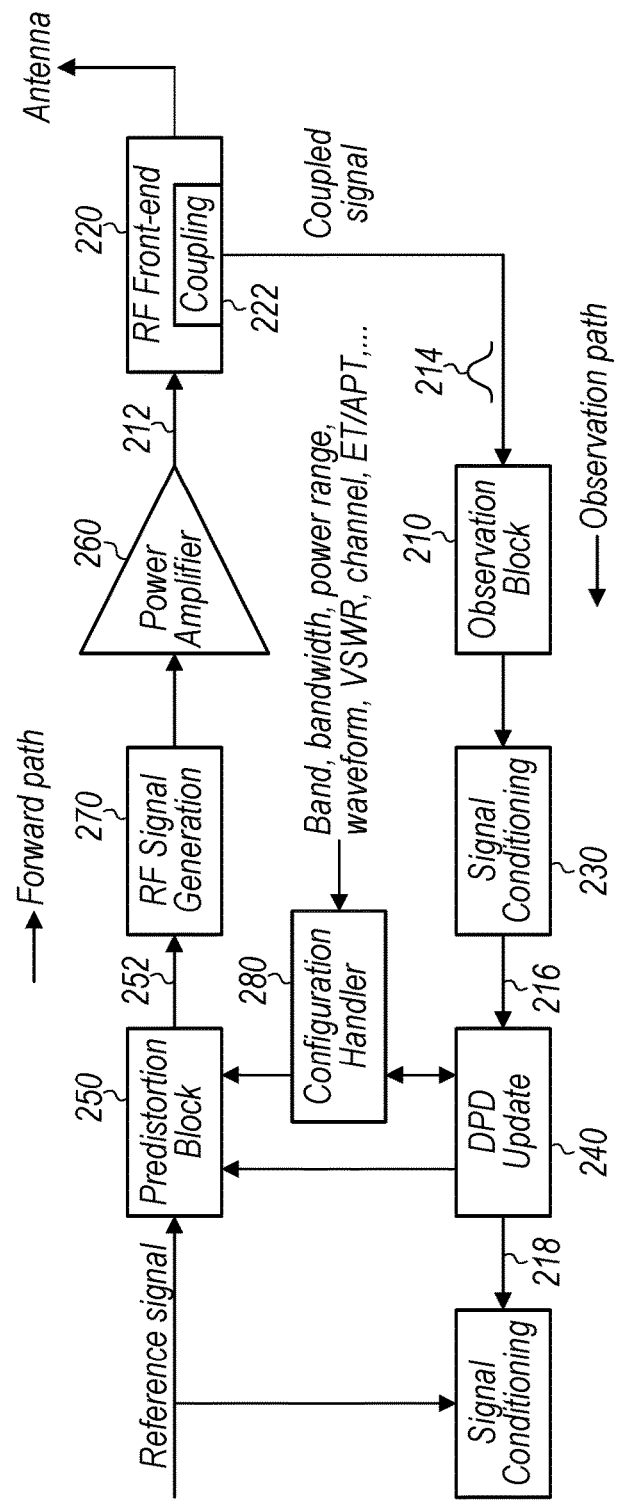
FIG. 2 illustrates an example of a predistortion circuit within a Transmitter.

According to some examples, the predistortion circuit 100 comprises a configuration handling circuit configured to select the first predistorter configuration or the second predistorter configuration depending on an operating characteristic of the wireless transmitter. The operating characteristics that may be used to select the predistorter configuration can also depend on the mode of operation of other elements within a wireless transmitter and/or on characteristics of the baseband signal to be transmitted, as subsequently discussed with respect to FIG. 2. FIG. 2 illustrates an example of a predistortion circuit within a transmitter allowing to adapt the predistorter complexity in response to predefined criteria. As a result, current consumption may be reduced, shorter calibration time may be achieved and memory area to store digital predistortion (DPD) coefficients may be saved.

As generally illustrated in FIG. 2, the implementation of a DPD system includes several tasks like predistortion of a baseband signal in the forward path, monitoring and capturing the distorted signal by means of an observation path and learning the predistortion function based on a comparison between reference data and data captured by the observation path. In a predistortion system, coefficients corresponding to a presently chosen predistorter configuration (implementing a corresponding predistortion function) may so dynamically updated. As illustrated in FIG. 2, a predistortion circuit 250 according to the examples is located in the forward path and may thus implement the corresponding techniques described below.

The observation path mainly comprises an observation block 210 which is connected to an RF front-end subsystem 220. Observation block 210 receives a portion of the distorted power amplifier (PA) signal 212 as its input signal 214. The distorted PA signal 212 may be captured by means of a coupler 222 that is part of the RF front-end subsystem 220. The input signal 214 is down-converted to baseband (BB) domain and further processed e.g. by running a time alignment with reference data, scaling, offset removal etc. within a signal conditioning block 230. A processed input signal 216 which still includes the distortions of the TX signal is used as first input to DPD update block 240. A corresponding reference signal 218 or corresponding reference data is the second input to the DPD update block 240. The reference signal corresponds to the baseband signal which was used to generate the distorted PA signal 212.

In further examples, the reference signal may be derived from the output 252 of predistortion circuit 250. An example for such an alternate configuration is subsequently shown in FIG. 11.

The DPD update block 240 updates a predistortion function of the presently used predistorter configuration (e.g. parameters used within a particular configuration of predistortion circuit 250) by comparing a sequence of the processed input signal 216 with a time aligned sequence of the reference signal 218.

The configuration handling circuit 280 decides on the appropriate predistorter configuration to be used within the predistortion circuit 250 based on at least one of various operating characteristics of the wireless transmitter. A new predistorter configuration is transferred to the predistortion block or circuit 250 and to the DPD update block 240. The predistortion circuit 250 may require the new predistorter configuration to select an appropriate or correct predistortion function and apply the correct predistortion function to generate a predistorted baseband signal. The predistorted baseband signal is provided to an RF signal generation circuit 270, which upconverts the predistorted baseband signal to a RF signal and provides the RF signal to PA 260 for amplification. The DPD update block 240 needs the new configuration to determine and update the coefficients used by the new predistorter configuration within predistortion circuit 250. In other words, configuration handling circuit 280 is configured to select the first predistorter configuration or the second predistorter configuration depending on an operating characteristic of the wireless transmitter.

According to some examples, the operating characteristic considered by the configuration handling circuit 280 comprises at least one of an Average Power Tracking Mode, an Envelope Tracking Mode, an output power range, a peak-to-average power ratio of the baseband signal, a peak-to-average power ratio of the input signal 214 (e.g. if the PA is in saturation or else introduces significant waveform clipping due to insufficient power headroom for the instantaneous peaks of waveform, a different predistorter function might be beneficial), a modulation scheme used to generate the baseband signal, a matching condition of an antenna, a transmit bandwidth, a transmit band, a transmit frequency range within the transmit band, a number of transmit clusters in a frequency domain, a frequency separation between transmit clusters, a bandwidth of each transmit cluster, and an acceptable spectral mask. While some examples may use only one of the above operating characteristics, other examples may use an arbitrary combination thereof to conclude on the predistorter configuration to be used. For example, the individual criteria may receive different weights before combining them to conclude on the appropriate predistorter configuration.

FIG. 3 shows an example how the decision on the different configurations may be based on a bandwidth criterion (LTE-40/-60 or LTE-20/15/10/5/3/1.4) and on a mode criterion (APT/ET). Both graphs illustrate the transmit power on the y-axis and the used frequency resources on the x-axis. The upper graph illustrates LTE 20 configurations having a bandwidth of 20 MHz and below. The predistorter configuration depends on transmission bandwidth and DC/DC converter mode, which can be APT or ET. In the event of a comparatively low transmission power below a first threshold 303, the PA may be operated in APT mode, since the overall power consumption is still moderate. In this setting and for the relatively uncomplex signal waveform of LTE20 signals, predistortion may not be necessary at all, given that the PA in APT mode may not show strong nonlinearity effects. For intermediate powers 304 between the first threshold 303 and a second threshold 305, the PA may be required to operate in ET mode, resulting in stronger nonlinearities. This may require the use of a predistorter model of moderate complexity, as for example a model having 3 coefficients as illustrated in column 308 of FIG. 3, upper graph. For high transmit powers 306 above the third threshold 305, predistortion may also be required with a complexity corresponding to the one of the ET mode at intermediate powers.

The lower graph illustrates LTE 40/60 configurations having baseband signals with a bandwidth of 40 MHz and above. Like in the upper graph, the PA mode changes from APT for the lower power ranges 312, 314, and 316 to ET modes for the higher power ranges 318 and 320. Due to the complex waveform of the high bandwidth LTE-40/60 signal, predistortion with intermediate complexity may already be required for the APT mode. In the example illustrated in FIG. 3, the corresponding predistorter function has 8 parameters, as illustrated in column 322. The most complex predistorter configuration is required for LTE40/60 signals at high transmit powers 318 and 320, where the PA is operated in ET mode and where the predistorter function has 25 parameters. In the examples of FIG. 3, the most complex predistorter configurations of transmit powers 318 and 320 may consume more than three or four times the current or power than that of the simplest configuration for intermediate powers 304 in LTE 20 and below. Using examples of predistorter circuits described herein may allow to save the delta in current (for example, the difference between 25 parameters of power ranges 320 or 318 compared with the 3 parameters of power range 320) since they allow to switch between different predistorter configurations, each being sufficient for the present setting of the wireless transmitter. With further increasing bandwidth of up-coming and future communication standards like, for example, 5G, the potential saving is likely to significantly increase.

In further examples, the configuration handler 280 can change the predistorter configuration that matches to a certain criterion further depending on the feedback from the DPD update block 240, e.g. based on a residual error after optimization, the condition of a matrix etc. In these examples, the configuration handler circuit 280 further comprises an input interface configured to receive a feedback signal depending on an output of a power amplifier 260 of the transmitter, wherein the configuration handler circuit 280 is further configured to select the first predistorter configuration or the second predistorter configuration depending on the feedback signal.

While the examples of predistortion circuits are not limited to a specific realization of the different predistortion functions that correspond to the different predistorter configurations, one particular implementation is subsequently described. In the following example, Volterra series based predistorter configurations are used, without limiting the scope of further examples.

The following formula shows a generic base band (BB) representation of a Volterra series based predistorter.

$$z(n) = \sum_{p=1}^{K} z_p(n) \text{ with}$$

$$z_p(n) = \sum_{k_1=0}^{N} \cdots \sum_{k_p=0}^{N} h_{k_1,\ldots,k_p}^{(p)} x(n-k_1) \prod_{u=3,5,\ldots}^{p} x(n-k_{u-1})x^*(n-k_u)$$

N is a memory depth, p is an order of the kernel and K is the maximum order. It is again noted that the examples are not limited to a particular polynomial representation. The polynomial representation above is just an example for better understanding of the use of different predistorter configurations.

In this particular example, a single configuration corresponds to the actual set of used Volterra kernels. A Volterra kernel is hereby characterized by the order of the polynomial p, by the memory depth N and by the time indices.

Examples $x(n-k_1)^* |x(n-k_1)|^{p-1}$ $x(n-k_1)^* |x(n-k_2)|^{p-1}$ $x(n-k_1)^* x(n-k_2)^* x(n-k_3)^*$ Each kernel is weighted by a coefficient $h(p)k_1 \ldots k_p$. The sum of the kernels generates the predistorted baseband signal 252 that is used to linearize the transmit chain by precompensating the nonlinearities of a power amplifier 260 which receives a radio frequency signal after its generation within radio frequency generation block 270.

Changing a coefficient, however, does not generate a new configuration since the coefficients are continuously updated by the DPD update block 240 to achieve optimum predistortion by the presently selected predistorter configuration. A coefficient update from a first value that is unequal to zero to a second value that is unequal to zero, therefore, changes the predistortion function but is not considered as a new configuration in the context of the examples.

Changing a coefficient from a non-zero value to zero or vice versa may be interpreted as changing the configuration since a coefficient with value zero means that a kernel is not used. In the context of the examples, a first configuration is different from a second configuration if a first set of active kernels (having a first number of computation nodes) associated with a first configuration is different from a second set of active kernels (having a second number of computation nodes) associated with the second configuration. Active kernel means hereby that the kernel is used and contributes to the signal that is generated by the predistortion circuit.

While examples of predistortion circuits can be used within all implementations where predistorting a signal is desirable, the following considerations detail an application in the field of wireless communication. Some examples of digital predistortion (DPD) are implemented to support LTE advanced or 5G modulation schemes. 5G NR (New Radio) is a new communication standard with commercial deployment expected to start in 2020. 5G NR will feature higher bandwidth and more complex modulation schemes in the uplink than, for example, 4G. For example, mobile stations may need to support up to 200 MHz aggregated bandwidth (2×100 MHz) in sub-6 GHz and more than 1 GHz in mmW range (>24 GHz). Baseline uplink modulation schemes that may be used in 5G NR are DFT-s-OFDM (which is similar to SC-FDMA used in LTE uplink) or CP-OFDM.

As already mentioned, the examples are not limited to modulation schemes according to LTE or 5G NR standard. Further examples are likewise applicable to any modulation scheme that imposes stringent linearity requirements to the TX chain.

In summary, at least two challenges arise for mobile terminals supporting 5G NR:
Higher channel bandwidth (up to 200 MHz) in the sub-6 GHz range, more than 1 GHz expected in mmW range.
Signals with higher peak-to-power ratio (PAPR) to increase throughput by using efficient modulation schemes like SC-FDMA 256 QAM and OFDM.

More complex signals with higher PAPR and higher constellation density (e.g. 256 QAM, 1024 QAM) have more demanding requirements for the linearity of the TX chain. More linearity requirements mean less AMAM- and AMPM conversion. This may conventionally be achieved by sufficient PA headroom preventing clipping of the modulation peaks and by increased PA quiescent current flattening the AMPM response of the PA. Both measures would, however, significantly increase the current consumption of the PA. Digital predistortion (e.g. in the baseband domain) according to an example can be used to achieve the linearity requirements while mitigating the increase of PA current consumption. By appropriate predistortion of the PA input signal less PA headroom and PA quiescent current are needed while maintaining sufficient linearity to, for example, meet ACLR (Adjacent Channel Leakage Ratio) and EVM (Error Vector Magnitude) targets.

FIG. 4 schematically illustrates a flowchart of an example of a method for generating a predistorted baseband signal for a wireless transmitter. The method comprises selection 410 to select a first predistorter configuration or a second predistorter configuration and predistortion 420 for generating the predistorted baseband signal using a baseband signal and the select predistorter configuration.

The above considerations rely on the following principles and further decision criteria for selecting predistorter configurations may be determined based on the following considerations. An increase of transmit bandwidth would likewise boost the complexity of the predistorter since the linearity characteristic of the TX chain depends on the instantaneous RF frequency and how fast the envelope of modulated RF signal changes. This is because the linearity characteristic depends on the IQ data stream which modulates the RF carrier. At higher bandwidths, AMAM- and AMPM response is not constant anymore and depends on the sequence of modulation symbols. This is also called memory effect and gets more pronounced at higher transmit bandwidths. There are multiple potential effects that introduce a memory effect in a TX chain. The effects are partly different for ET (Envelope Tracking) and APT (Average Power Tracking) systems. Compared to APT operation, ET introduces severe non-linear effects in transmit chain whereas the non-linear effects partly depend on the RF frequency. As a result, the non-linear characteristic can change within a few MHz causing a dispersive TX channel. In a dispersive TX channel, the predistortion characteristic is strongly mapped to the absolute RF frequency. DPD coefficients for a given predistortion function that are optimized for a $1^{st}$ frequency range will show less linearity improvement in a $2^{nd}$ frequency range if the $2^{nd}$ frequency range is shifted by a few MHz if the channel is dispersive. To overcome the frequency dependence of the AMAM and AMPM response, memory predistortion is required.

Some relevant effects causing a dispersive channel in ET mode are:
  ET delay dispersion over frequency
  Too low tracker bandwidth cutting the envelope bandwidth and introducing delay variations.
  Too low VCC bandwidth in the PA module
  PA load-pulling due to TX filter: This effect is more severe in an ET system having a PA operating in compression, where it exhibits higher load sensitivity. TX filters feature an input impedance (=PA load impedance) that is highly frequency dependent due to the resonators being used to form the filter characteristic.

The ET delay dispersion and load-pulling due to TX filter are the dominating effects for a dispersive channel. While both effects also occur in the center of a TX band, they get more severe at the band edges with the transition from pass band to stop band.

At high transmit bandwidths (e.g. >400 MHz) APT operation may be a PA supply scheme if an ET approach that can support >400 MHz with reasonable efficiency and system complexity may be difficult to implement. In APT there are at least two dominant effects introducing memory in a TX chain:
  PA load-pulling due to the TX filter. The effect occurs also in ET but is less pronounced in APT Operation where the PA operates in its linear regime.
  Limited PA bias bandwidth: This effect also occurs in an ET system but is normally hidden by VCC bandwidth limitations in the ET System. In APT systems, this effect is more dominant. A well-designed PA bias network provides a low impedance from DC up to BB modulation bandwidth. The low impedance is required to avoid re-modulation effects, which introduce intermodulation errors in the spectrum of the PA output signal.

Signal deteriorations caused by limited PA bias bandwidth depend on the envelope of the RF signal and on how fast the envelope changes.

PA load pulling effects depend on the instantaneous RF frequency and the impedance response of the TX filter over the modulation bandwidth. When the instantaneous modulation frequency is at a $1^{st}$ frequency, the PA is loaded by a $1^{st}$ impedance, when the instantaneous modulation frequency is at a $2^{nd}$ frequency the PA is loaded by $2^{nd}$ impedance. Both impedances might be quite different especially if the separation between the instantaneous frequencies is large which may happen in case of a signal with high transmit bandwidth. As a consequence, the resultant AMAM- and AMPM response at the $1^{st}$ frequency is different from the response at the $2^{nd}$ frequency.

To linearize a PA output in such circumstances, the predistortion circuit needs to create an inter modulation (IM) spectrum that cancels the IM spectrum of the PA at its output. The demands for the predistortion circuit are exemplarily described assuming a transmit bandwidth of 1 GHz. The bandwidth of the IM3 spectrum ($\rightarrow x^3$) is then 3 GHz, the bandwidth of the IM5 spectrum ($\rightarrow x^5$) is 5 GHz. The predistorter needs to generate the IM3- and IM5 spectrum in BB domain to achieve the desired goal of linearization of the PA output. If, for example, both IM3 and IM5 spectrums shall be cancelled, the required bandwidth in BB domain is +/−2.5 GHz. As a result, the computation nodes (e.g. multipliers) that are used to generate the predistortion signal need to operate at a sample rate of 5 GHz to preventing overlapping (aliasing) of the IM5 spectrum with its replicas in the frequency domain.

Figure 5:
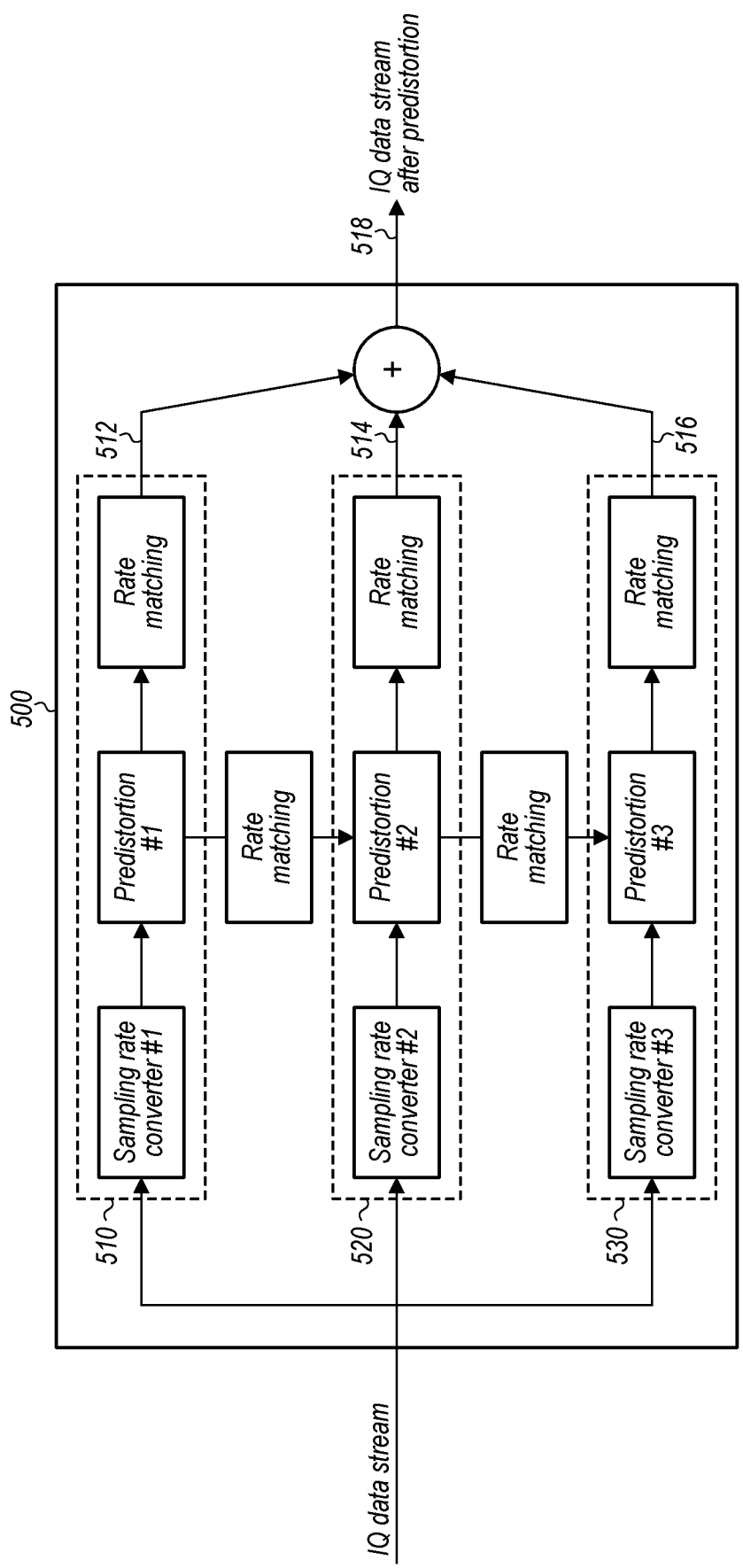
FIG. 5 illustrates an example of a predistortion circuit having computation nodes operating at different rates.

However, computation nodes or multipliers operating at 5 GHz may draw significant current. The example of a predistortion circuit 500 illustrated in FIG. 5 allows to deploy memory predistortion in transmit systems featuring a high transmit bandwidth while reducing current consumption and design complexity of the predistorter circuit 500. FIG. 5 illustrates an example where the different predistorter configurations may distinguish by the rate at which groups of computation nodes within the different configurations are operated at.

In the example of FIG. 5, the predistortion circuit 500 is separated into 3 parts or sub-circuits 510, 520, and 530 (also referred to as blocks), which may contribute to a single predistorter configuration or which may contribute to different predistorter configurations in arbitrary combinations of the sub-circuits 510, 520, and 530. The computation nodes of each sub-circuit 510, 520, and 530 operate at different sample rates. In particular, a first number of computation nodes are configured to operate at a first rate and a second number of computation nodes are configured to operate at a second rate, the second rate being higher than the first rate. Further examples may also have 2 sub-circuits that are selectively or jointly activated for a predistorter configuration. More than three sub-circuits may also be appropriate depending on the predistortion function to be implemented and on the order of IM spectra to be considered. Further examples are not limited to a specific number of blocks or to specific mathematical operations executed by a block. The total predistortion function performed by the predistortion circuit 500 is broken down in partial functions with different bandwidth requirements and the partial functions are mapped to sub-circuits that run at different appropriate rates.

If all sub-circuits are used within a predistorter configuration, each sub-circuit generates a partial signal 512, 514, and 516 as a part of the predistortion signal 518. The partial signals 512, 514, 516 are combined at the output of the sub-circuits 510, 520, 530 after applying a rate matching to equalize different sampling rates. For example, a sample rate converter may be configured to match an output of the first number of computation nodes to the second rate to generate a rate matched output of the first number of computation nodes. Further, a combination circuit may be configured to combine an output of the second number of computation nodes and the rate matched output of the first number of computation nodes. In FIG. 5 it is assumed that sub-circuit 510 (#1) comprises all linear terms that do not increase the bandwidth of the input signal, sub-circuit 520 (#2) comprises all $3^{rd}$ order kernels generating a signal with 3 times the bandwidth of the input signal, and sub-circuit 530 #(3) comprises all $5^{th}$ order kernels generating a signal with 5 times the bandwidth of the input signal. Therefore, sub-circuit 520 operates at 3 times the sampling rate of sub-circuit 510, and sub-circuit 530 at 5 times the sampling of sub-circuit 510 to avoid aliasing.

The highest sampling rate and the highest current consumption is, therefore, only spent for $5^{th}$ order kernels where the highest sampling rate is required to avoid aliasing. The same applies to the $3^{rd}$ order kernels. The example of a predistortion circuit 500 ensures that the computation nodes of the predistortion circuit 500 only operate at a sampling rate that is required to prevent aliasing. The example of a predistortion circuit 500 helps to save energy as compared to a single rate implementation where all computation nodes (multipliers) would run at highest rate. The example of a predistortion circuit 500 also save energy as compared to a polyphase implementation that would increase the number of multipliers operating at a lower sampling rate, which might reduce some design challenges at high sampling rates but would not help to decrease current consumption.

As compared to alternative approaches, the current consumption of predistorter circuit 500 is significantly reduced by running the computation nodes (e.g. multipliers) at different rates depending on, e.g., the signal bandwidth.

FIG. 7 illustrates the deterioration the spectrum of the predistorted baseband signal might suffer from due to aliasing if an insufficient rate would be chosen for the operation of the predistortion circuit. In FIG. 7 it is assumed that Intermodulation distortions of $3^{rd}$ order shall be considered by the predistortion function. The main spectrum 710 of the predistorted baseband signal overlaps with the first replica 712 of the predistorted baseband signal so as to deteriorate the quality of the predistorted baseband signal if the sample rate of the computation nodes was chosen too low. In using a predistorter configuration according to an example of a predistortion circuit, the sampling rate may be chosen sufficiently high for every IM order to be considered without increasing the current consumption more than necessary to achieve this goal. In other words, FIG. 7 illustrates the harmful interference of the IM spectrum caused by a too low sampling rate. In FIG. 3, the overlapping of the IM3 spectrum will degrade the linearization result since the overlap adds unwanted IM contributions in the spectrum of the predistorter circuit.

FIG. 6 shows a further example of a predistortion circuit 600. First order computations are performed at the lowest rate within the first sub-circuit 610 (#1), second order computations are performed at an intermediate rate within the second sub-circuit 620 (#2) and third order computations are performed at the highest rate within the third sub-circuit 630 (#3). Other than in the example of FIG. 5, the sub-circuits 610, 620, 630 are serially connected and comprise sample rate converters 612, 622, and 632 to adjust the sample rates between the subsequent sub-circuits of the serially connected chain of sub-circuits.

In a further example it is implemented to use intermediate results generated in a first block in at least a second block after appropriate rate matching to mitigate the total number of multipliers. This is illustrated by the vertical connections between the sub-circuits 510, 520, and 530 in FIG. 5.

In summary, digital predistortion for ultra-high bandwidth signals in mobile terminals may be heavily constrained by the battery current consumption. In mobile terminals the current consumption is key for compelling customer experience and for solving critical heat dissipation issues that occur in a small form factor device. For example, a predistorter configuration with moderate complexity may already require 30 to 60 multipliers for very high bandwidth signals, which may draw a couple of 100 mA of the predistortion circuitry (in addition to the PA current), depending on technology and digital implementation.

The increase of transmit bandwidth being introduced by 5G NR will create new challenges for mobile terminals. The increase of transmit bandwidth is likely to be faster than the deployment of new process nodes that intentionally improve the baseline current year by year (e.g. 28 nm, 16 nm, 10 nm).

As a non-favorable consequence the current consumption of conventional digital predistorters would heavily increase despite of new process nodes. There is a strong need to introduce new methods and evolved digital circuitries so that current consumption does less scale with the increasing transmit bandwidth. Otherwise the excessive current consumption of digital part at ultra-high bandwidth will prevent or delay its deployment. The increase of current consumption can be mitigated by the examples described herein.

In summary, examples of the methods and predistortion circuits described previously run the calculations that are required to generate the predistorted signal on at least two sampling rates whereas the sampling rate depends on the bandwidth of the signal after applying the predistortion specific mathematical operations. An example of a predistortion circuit comprises at least two sub-circuits whereas each sub-circuit generates a partial signal of the predistorted signal and whereas a sampling rate of a first sub-circuit is different from a sampling rate of a second sub-circuit.

Examples of predistortion circuits could help to deploy predistortion for signals with ultra-high bandwidth that for instance will occur in 5G mmW applications. They mitigate the increase of current consumption and design complexity due to the upcoming boost of transmission bandwidth. Examples of predistortion circuits allow to provide mobile handsets in small form factor and with leading edge battery current consumption.

For example, in a 5G NR mobile terminal, predistortion circuits are expected to have a significant impact on battery current (4 operation time) and dissipated power/heating (4 device size and form factor).

A particular example of a predistortion function suitable to implement a predistortion circuit according to FIG. 5 or FIG. 6 is a Volterra series based function. The following formula shows the generic BB representation of a Volterra based predistorter.

$$z(n) = \sum_{p=1}^{K} z_p(n) \text{ with}$$

$$z_p(n) = \sum_{k_1=0}^{N} \cdots \sum_{k_p=0}^{N} h_{k_1,\ldots,k_p}^{(p)} x(n-k_1) \prod_{u=3,5,\ldots}^{P} x(n-k_{u-1})x^*(n-k_u)$$

N is the memory depth, p is the order of the kernel and K is the maximum order. However, further examples are not limited to this specific polynomial representation. The polynomial representation is just given to better illustrate the meaning of the x^3, x^5, x^7 terms in a wider context.

While the previous examples address the forward path of a system employing predistortion, further examples address the observation path and a control circuit used to update the predistortion parameters which are used within a predistortion circuit to generate a predistorted baseband signal.

An example of a control circuit 800 for a predistortion circuit is illustrated in FIG. 8. The control circuit 800 for a predistortion circuit comprises a feedback signal input 810 configured to receive a feedback signal 812 related to an output of a power amplifier as well as bandwidth limitation circuitry 820 configured to limit a bandwidth of the feedback signal 812 to derive a bandlimited feedback signal 822. A parameter handling circuit 830 is configured to update predistortion parameters used within the predistortion circuit based on the bandlimited feedback signal 822. Optionally, further examples may also comprise an output interface 840 to output the updated predistortion parameters. The limitation of the bandwidth may be performed by an arbitrary filter circuit in a digital or an analog domain. For example, a FIR filter may be used in the digital domain.

Using a bandlimited feedback signal 822 to update the predistortion parameters used within predistortion circuit may significantly decrease power consumption of the control circuit 800 and of further components within the feedback or observation path since power consuming components capable of operating at high bandwidths may be avoided.

Conventional implementations, however, use a continuous and broad spectrum for predistortion learning and to calculate the updated predistortion parameters. Predistortion learning describes the process of generating a predistortion function that is intended to compensate non-linear effects introduced by the analog transmit system. For predistortion learning, an observation path is required that captures a portion of the distorted RF output signal of the transmit system (as, e.g., generated by a power amplifier) and down-converts it to BB domain for further processing, as for example illustrated in FIG. 9. For the example, for the future communication standards already elaborated on before, energy savings of an example illustrated in FIG. 8 may be significant as compared to a conventional approach. Assuming a signal bandwidth of 1 GHz, the IM spectrum may exhibit a bandwidth of 5 GHz (covering IM3 and IM5 products). Thus, the observation path of a conventional solution would have to be flat, both in terms of delay and amplitude, over a bandwidth of 5 GHz in the RF domain and, for example, an ADC sampling rate of 5 GHz would be required to meet Nyquist's criteria. A 5 GHz ADC, however, is complex and draws significant current.

The present examples of control circuits, instead, offer a compelling solution how to deploy memory predistortion in transmit systems featuring a high transmit bandwidth (e.g. 5G NR) while reducing current consumption and design complexity of the predistortion implementation. The subsequently illustrated examples address the observation of the signal output by a power amplifier and introduce a concept to reduce the complexity of the observation path.

FIG. 9 illustrates an example of a control circuit 940 within a transmitter circuit. The transmitter circuit comprises a predistortion circuit 910 configured to receive a baseband signal 912 and to generate a predistorted baseband signal 922. To generate the predistorted baseband signal 922, the predistortion circuit uses a select predistorter model. The predistortion function of the predistorter model uses predistortion parameters which are dynamically updated to optimize the result of the predistortion. The predistortion parameters are continuously updated based on feedback from an amplified radio frequency signal 932 by means of a control circuit 940. An upmixer 920 generates the radio frequency signal using the predistorted baseband signal 922 and a local oscillator signal. A power amplifier 930 is coupled to an output of the upmixer 920 and generates an amplified radio frequency signal 932.

The control circuit 940 for the predistortion circuit 910 comprises a feedback signal input 941 configured to receive a feedback signal 934 related to an output of a power amplifier 930. According to some examples, feedback signal 934 is a copy of the amplified radio frequency signal 932 having low power. Bandwidth limitation circuitry 942 is configured to limit a bandwidth of the feedback signal 934 to derive a bandlimited feedback signal 936. The control circuit 940 further comprises a baseband signal input 943 configured to receive the baseband signal or reference signal 912. Further bandwidth limitation circuitry 944 is configured to limit a bandwidth of the baseband signal 912 to derive a bandlimited baseband signal 914. A parameter handling circuit 946 is configured to update the predistortion parameters used within the predistortion circuit 910 based on the bandlimited feedback signal 936 and on the bandlimited baseband signal 914. In the particular example of FIG. 9, the bandlimited feedback signal 936 is further digitized by mean of an ADC 945. Further signal shaping is performed by means of a signal conditioning circuit 947 and a sampling circuit 949 to be able to directly compare the bandlimited feedback signal 936 (as output from sampling circuit 949) and the bandlimited baseband signal 914. For example, signal conditioning circuit 947 and sampling circuit 949 may perform sample rate conversion and/or time alignment so that corresponding samples of the bandlimited feedback signal 936 and bandlimited baseband signal 914 can be directly compared by means of a comparator circuit 946a which is part of parameter handling circuit 940. Based on the comparison, update circuit 946b within parameter handling circuit 946 calculates and updates the predistortion parameters which are then communicated to predistortion circuit 910 to close the loop of control and to optimize the linearization achieved by the select predistorter model.

In other words, the transmitter circuit/communication system of FIG. 9 comprises a forward path where digital predistortion is used to improve the linearity of a transmit signal, an observation path that is coupled to the transmit path so that a coupled signal (feedback signal 934) includes the non-linear distortions of the transmit path, a comparator block that compares the coupled signal with a reference signal, and an update block that changes the predistortion function in the forward path based on a result of the comparator block.

In summary, an update of the predistortion parameters is performed based on a comparison between the feedback signal and a reference signal at discrete frequencies points within the transmission spectrum. An observation bandwidth for the feedback signal and the reference signal may be chosen such that there is no overlapping of adjacent observation channels. The reference signal may be derived from the baseband signal before predistortion as illustrated in FIG. 9. Further examples may likewise derive the reference signal from the predistorted baseband signal at an output of the predistortion circuit.

Figure 10:
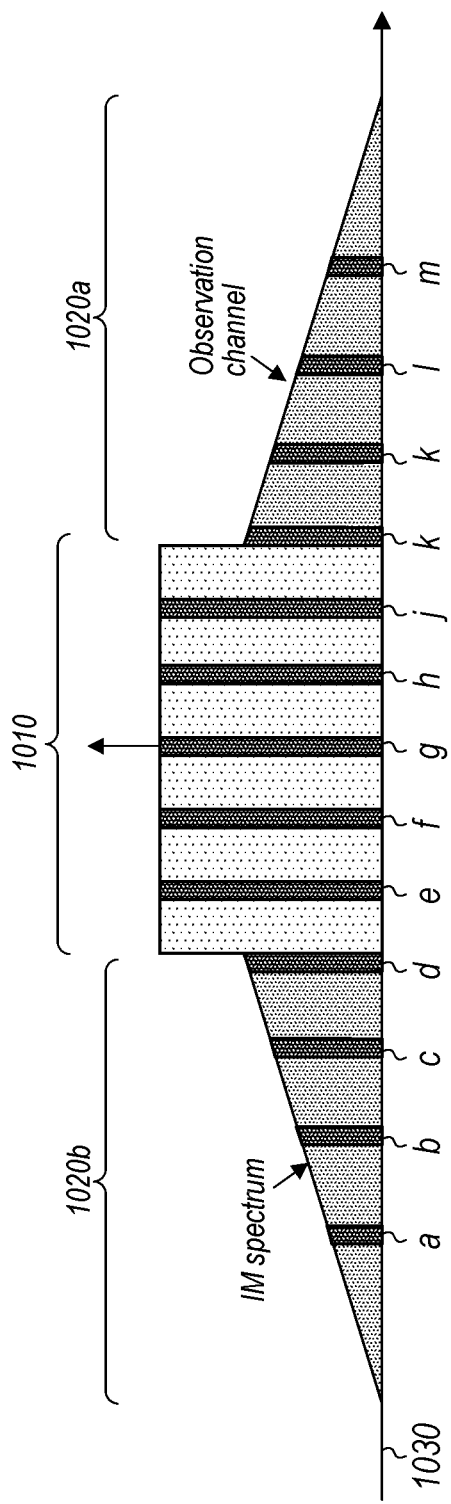
FIG. 10 illustrates an example of a signal spectrum.

FIG. 10 illustrates the idea of using discrete sample intervals in the frequency domain instead of using the full spectrum to determine the predistortion parameters. Both signals, reference and feedback signal, are sampled at identical frequency offsets with identical measurement bandwidth. FIG. 10 schematically illustrates the spectrum inside the transmission bandwidth 1010 and of neighboring frequency portions 1020a and 1020b. The width of the neighboring frequency portions 1020a and 1020b to be monitored depends on the order of the IM distortions to be considered.

FIG. 10 illustrates a particular example having 13 observation channels 1030a to 1030m of limited bandwidth. The predistortion parameters may be updated independently for each of the observation channels 1030a to 1030m. According to some examples, the observation channels 1030a to 1030m are processed subsequently in a predetermined order to consider contributions from the entire spectrum for updating the predistortion parameters. The spacing between neighboring observation channels does not need to be equidistant. Depending on the response of the intermodulation spectrum it may also be beneficial to select closer separation at a first frequency offset, for example where the IM spectrum change over frequency is more pronounced compared to the change at a second frequency offset. As illustrated in FIG. 10, the spectrum is divided into chunks 1030a to 1030m for both the reference spectrum of the reference signal and the coupled spectrum of the feedback signal and the predistortion function (the predistortion parameters) is updated based on a comparison of the chunks. According to some examples, the compared chunks of the reference signal and the feedback signal have the same bandwidth. However, neighboring chunks may have different bandwidths.

As illustrated in FIG. 10, examples use narrowband signals for determination of the predistortion parameters. According to some examples, the measurement bandwidth is a few megahertz, e.g. 1 MHz, 3 MHz. 5 MHz, 10 MHz. Using the bandlimited signals may greatly reduce complexity and current consumption. Further, the determination of the predistortion parameters (DPD coefficients) can be done at lower rate in some examples, which depends on the measurement bandwidth, and, e.g., on Nyquist's formula. However, the predistortion circuit or block itself which creates the predistorted baseband signal may run at full rate to avoid aliasing of the IM spectra generated by the predistorter circuit.

Figure 11:
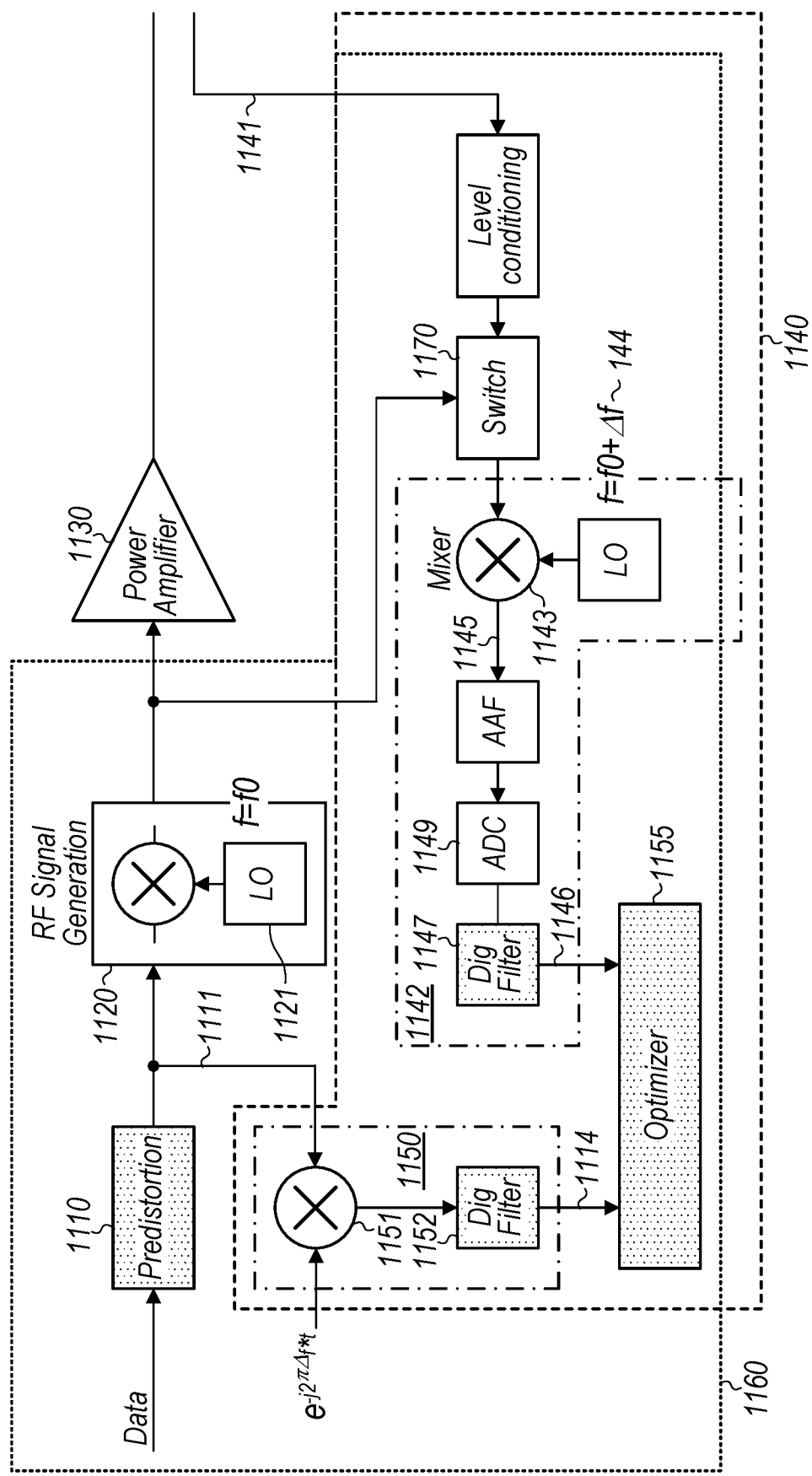
FIG. 11 illustrates an example of a control circuit configured to compare bandwidth limited portions of a reference signal and of a feedback signal.

FIG. 11 shows an example as to how the corresponding frequency chunks may be generated. As opposed to the example of FIG. 9, the reference signal is generated from the predistorted baseband signal at an output of predistortion circuit 1110. Like in FIG. 9, it is desired to reduce the bandwidth of the observation path by narrowband sampling a feedback signal and a reference signal in the frequency domain. As a result, the bandwidth of the components within the observation path does not need to be high enough to capture the complete feedback signal, resulting in a decrease of complexity and power consumption. Similar to FIG. 9, FIG. 11 illustrates an upmixer 1120 to generate a radio frequency signal using a local oscillator signal 1121. A power amplifier 1130 amplifies the RF signal. A control circuit 1140 comprises bandwidth limitation circuitry 1142 to limit a bandwidth of the feedback signal to derive a bandlimited feedback signal 1146. In the example of FIG. 11, the bandwidth limitation circuitry 1142 comprises an adjustable mixer 1143 configured to downmix the feedback signal 1141 using a feedback oscillator signal 1144 to generate a downmixed feedback signal 1145, The feedback oscillator signal 1144 has the frequency of the local oscillator signal 1121 plus an observation frequency offset $\Delta f$.

A band pass filter circuit 1147 is configured to band filter the downmixed feedback signal 1145 to generate the bandlimited feedback signal 1146. Prior to filtering, the downmixed feedback signal 1145 id digitized by ADC 1149. In summary, the bandwidth limited feedback signal is generated by first downmixing the RF signal with a frequency of the feedback oscillator signal and by subsequent bandpass-filtering the signal to arrive at an observation frequency chunk centered at the frequency of the feedback oscillator signal with a bandwidth as given by the bandpass filter.

The control circuit 1140 further comprises a reference signal generation circuit 1150 comprising a reference signal input configured to receive the predistorted baseband signal 1111 form an output of the predistortion circuit 1110. The reference signal generation circuit 1150 comprises further bandwidth limitation circuitry configured to limit a bandwidth of the reference signal to derive a bandlimited reference signal. The further bandwidth limitation circuitry comprises a frequency shifter 1151 configured to shift the predistorted baseband signal by the frequency offset and a further band pass filter circuit 1153 configured to bandpass filter the shifted predistorted baseband signal 1111 to generate a bandlimited predistorted signal 1114. The bandlimited predistorted signal 1114 and the bandlimited reference signal are so created as corresponding frequency chunks within the spectrum so that an optimization circuit 1155 may directly compare the two signals to derive updated predistortion parameters. In other words, further bandwidth limitation circuitry 1150 comprises a frequency shifter 1151 configured to shift the reference signal by the inverse of the observation frequency offset.

In summary, to realize appropriate frequency domain sampling, the LO frequency of the mixer in the observation path is swept and said LO frequency is typically set to the mid frequency of the frequency chunks. The LO frequency sweeps from chunk to chunk, the signal is down converted, filtered (so that reference signal/predistorted baseband signal and coupled feedback signal experience the same filtering) and fed to optimization circuit 1155 (optimizer block).

When sweeping the LO frequency, LO phase at a new frequency might be unknown in some circumstances. An unknown LO phase would prevent learning of the predistorter coefficients since the optimization circuit 1155 could not distinguish if an observed phase shift is caused by PA or by LO frequency change. Some examples optionally include switch 1170 which can be configured to connect an input signal from before the PA 1130 to the mixer 1143. In a first measurement, the input signal may then be connected to the mixer 1143. Since the input phase does then not include the PA phase distortions the signal can be used to determine the LO phase without contributions from PA 1130. In a second measurement, the output signal of the PA feedback signal 1145 may then be measured as an input to the optimizer circuit 1155. In other words, control circuit 1140 may further comprises a phase control input coupled to an output of the upmixer to receive a phase control signal, wherein the control circuit 1140 is further configured to adjust a phase of the feedback signal based on the phase control signal. FIG. 12 again schematically illustrates the processing performed in the example of FIG. 11 to build a system of equations intended to determine the predistortion coefficients for a select predistorter configuration.

During the optimization process a system of linear equations is solved, e.g. by means of the least square (LS) algorithm. FIG. 15 illustrates an example for such a system of linear equations for a predistortion function based on a Volterra Series.

Figure 12:
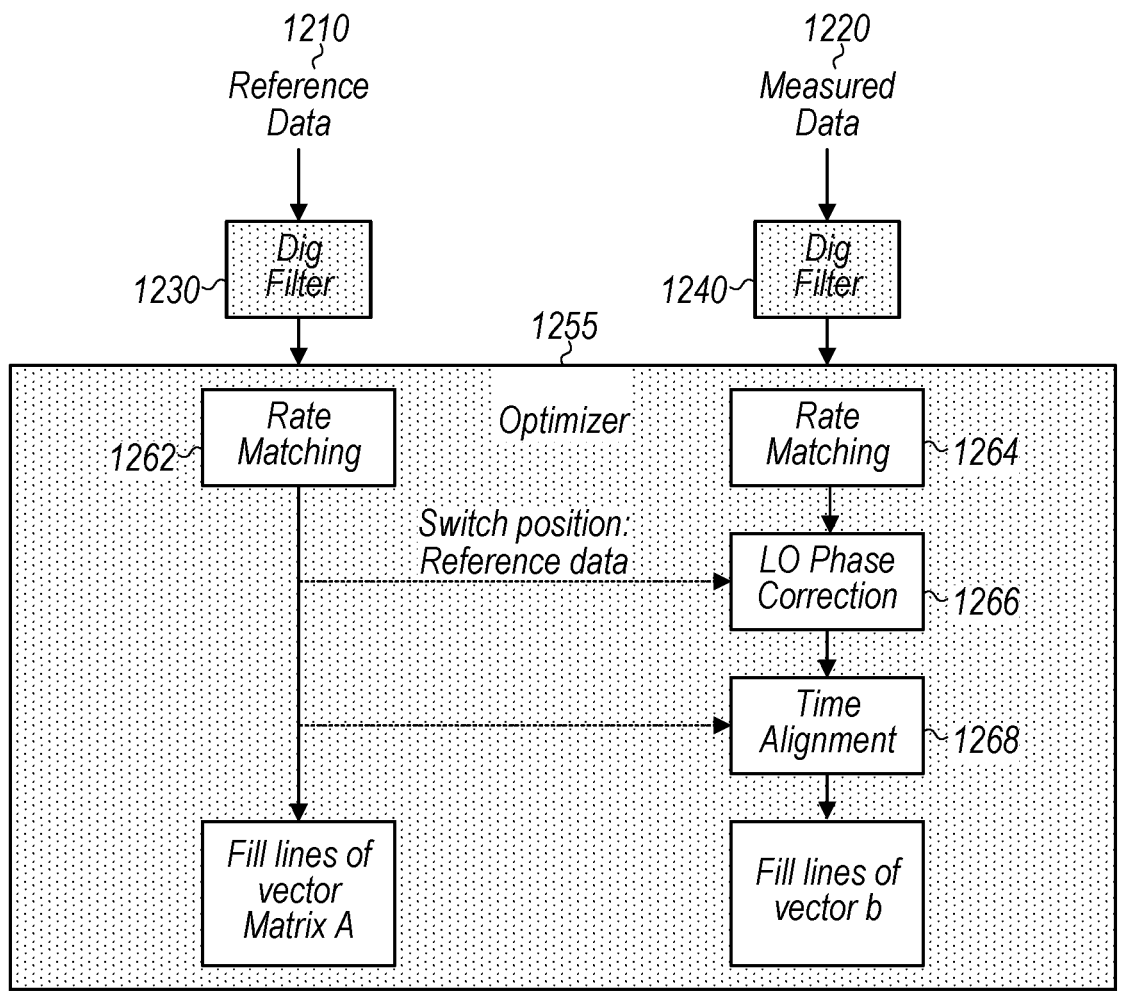
FIG. 12 illustrates an overview of a method to compare a reference signal 1210 and a feedback signal 1220.

The lines of the matrix A are derived from different chunks or observation channels, at least one line for each observation channel. For an observation channel, data may be accumulated as illustrated in FIG. 12. Reference signal 1210 and feedback signal 1220 may be collected and bandwidth limited by means of filters 1230 and 1240, respectively. In order to be able to use the samples of both signals to calculate the predistortion parameters, further matching of the signals samples may be performed within optimization circuit 1255. For example, rate matching circuits 1262 and 1264 may be used to align the sample rates. Optionally, a phase calibration may be performed for the feedback signal as illustrated above. To this end, an optional phase correction circuit 1266 for the local oscillator signal 1144 may be present as well as a subsequent time alignment circuit 1268. After compensating ambiguities and proper time alignment, the samples of the reference signal 1210 and of the feedback signal 1220 may be used as an input to the linear equations illustrated in FIG. 15.

Each line of Matrix A includes a reference data point that is predistorted by the predistortion function (from the bandlimited predistorted baseband signal). Each predistorted data point of vector b is compared with a point of the coupled data/the bandlimited feedback signal of vector h. This is done for a large number of data points (e.g. a few thousands) and the predistortion coefficients hk are determined such so that they meet a certain metric e.g. least square error.

According to some examples, the optimization circuit 1155 may run at a low rate if low pass filtered data is used.

Figure 13:
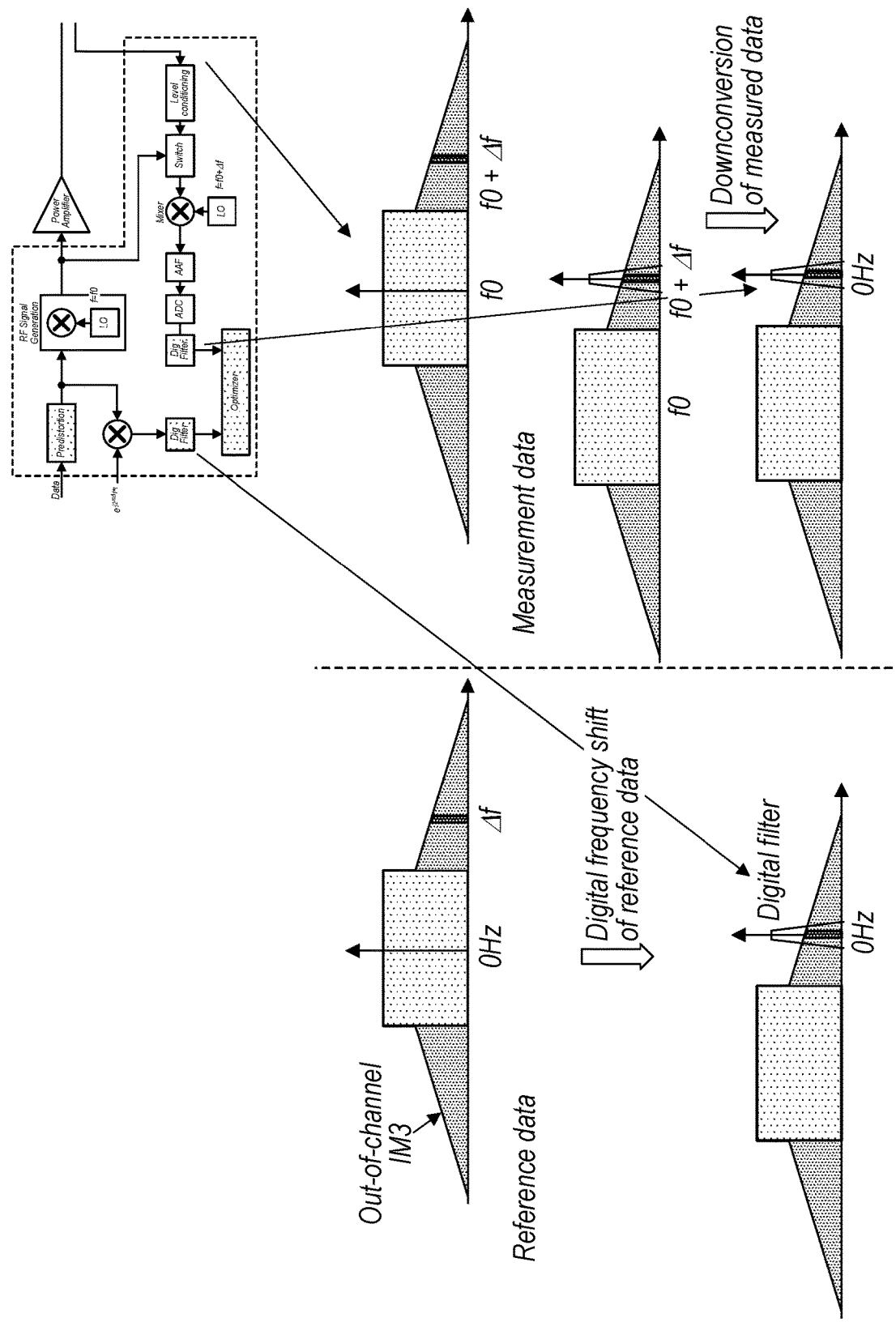
FIG. 13 illustrates a graphical representation of the generation of the bandlimited signals according to FIG. 11.

FIG. 13 again illustrates as to how the bandwidth limitation circuitry and the further bandwidth limitation circuitry of FIG. 11 may cooperate to guarantee that corresponding frequency chunks of the predistorted baseband signal and the feedback signal are used by means of optimization circuit 1155.

Figure 14:
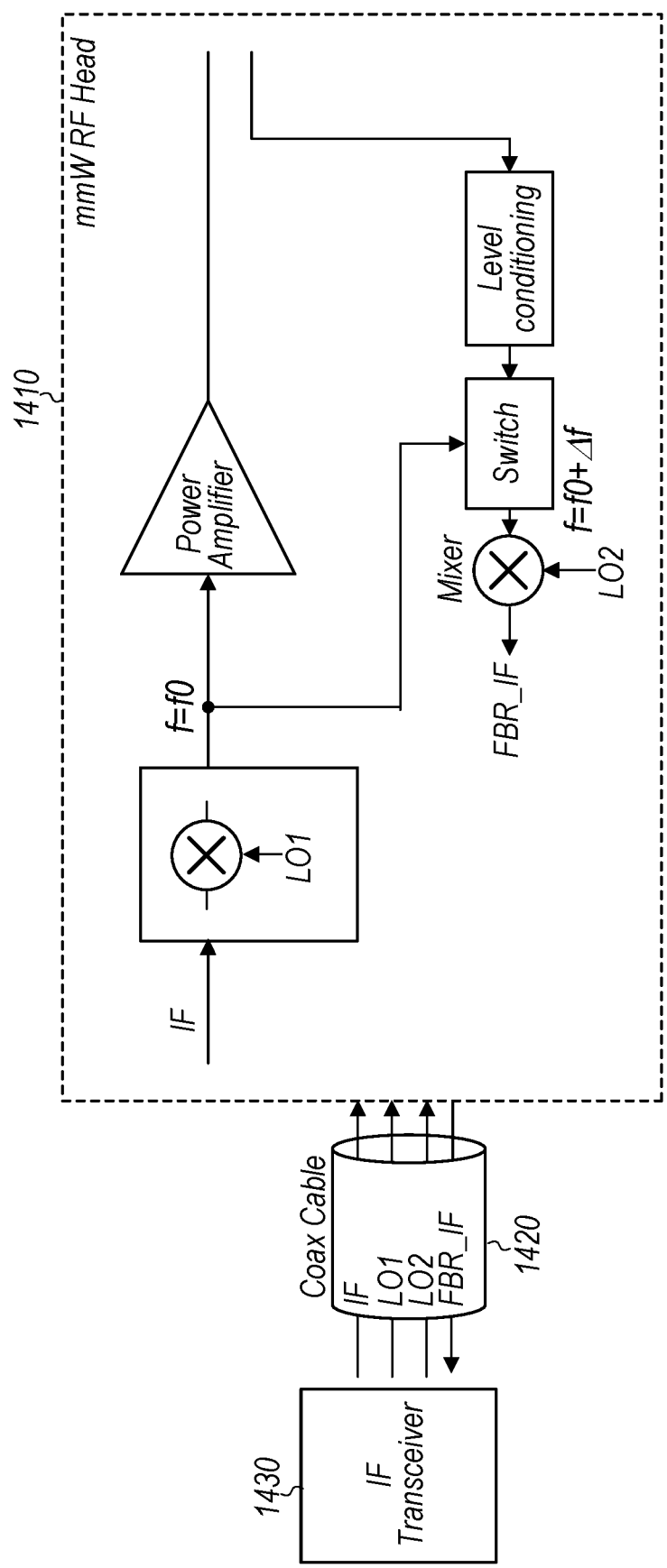
FIG. 14 illustrates an example of a millimeter wave implementation.

FIG. 14 is an example how the further examples may be used in mmW applications. In mmW designs, it may be attractive to have a RF head 1410 that includes the critical analog functions for transmit, receive and antenna beamforming. Since a communication device will have multiple heads for MIMO purposes, the RF signals and the LO signals are provided by special coax cables. As a consequence, the observation path may be multiplexed within a transmitter circuit 1430.

In summary, the previous examples may enable to practically use predistortion for signals with ultra-high bandwidth that for instance will occur in 5G mmW applications. It will mitigate the increase of current consumption and design complexity due to the upcoming boost of transmission bandwidth. The examples address the observation path and introduce methods reducing the complexity of the observation path by using multiple narrowband signals instead of a single wideband signal which may provide at least for the following:

- A lower sample rate of the ADC (factor of 100 or more depending on signal bandwidth).
- Relaxed requirements for the amplitude- and frequency response of the observation path due to narrowband signals→less compensation efforts in digital domain to equalize the observation path and less critical RF analog design.
- Relaxed requirements for delay error between coupled signal and reference signal. As of today a signal with a bandwidth of 60 MHz can tolerate 1 . . . 3 ns delay error. For 1 GHz bandwidth the tolerable error will be <<1 ns which would make it difficult to find a practical implementation for full bandwidth monitoring.

Further, cellular data transmission standards my not only rise bandwidth but also output power. In conventional implementations, a mobile terminal might transmit with a maximum of 23 dBm. Up-coming power class 2 defines 26 dBm output power for all TDD bands, power class 1 defines 31 dBm output power for low band Band14. Due to high bandwidth, high channel frequencies, power saving envelope tracking techniques and higher output power, the time dependent nonlinearities (i.e. memory effects) of the analogue circuitries become more and more visible. Since nonlinearities create higher frequencies (harmonics), the computations relating to a predistortion model have to be calculated at high sampling rates. Many multiplications due to complex mathematical models (Volterra Series), high wordlengths (due to exponentiation for the harmonics) and high sampling frequency (due to frequency expansion of harmonics) may result with consumption of a lot of current.

FIG. 16 illustrates an example of an apparatus 1600 for predistorting a baseband signal 1601 which may allow to (significantly) reduce the current consumption.

Apparatus 1600 comprises a predistortion circuit 1610 configured to determine samples of the baseband signal 1601 at a first sample rate. For example, the first sample rate may be equal to or higher than a sample rate of the baseband signal 1601. Further, predistortion circuit 1610 is configured to calculate and output samples of a predistorted baseband signal 1602 at a second sample rate based on predistortion parameters (e.g. based on a Volterra series) and the samples of the baseband signal 1601. The second sample rate is lower than the first sample rate. That is, predistortion circuit 1610 uses an output sample rate for calculating the predistorted baseband signal 1602 that is lower than the input sample rate of the baseband signal 1601.

Apparatus 1600 further comprises an upsampling filter 1620 configured to calculate samples of the predistorted baseband signal 1602 at the first sample rate based on the samples of the predistorted baseband signal 1602 at the second sample rate.

The higher first sample rate may allow to track all higher order exponential harmonics in the baseband signal 1601 so that the course of the baseband signal 1601 is known with sufficient precision. On the other hand, the lower second sample rate may allow to save current since the predistortion is done at this lower sample rate. The upsampling filter then restores the input sampling rate of the predistortion circuit 1610. However, since upsampling filters use fixed coefficients and since no exponential order occurs, the mere upsampling calculation is much simpler than the predistortion at higher sample rate. Accordingly, current may be saved and a reasonable attenuation of the harmonics may be achieved.

This may become more evident from the following non-limiting numerical examples, which are given in conjunction with FIGS. 17 to 20.

Figure 17:
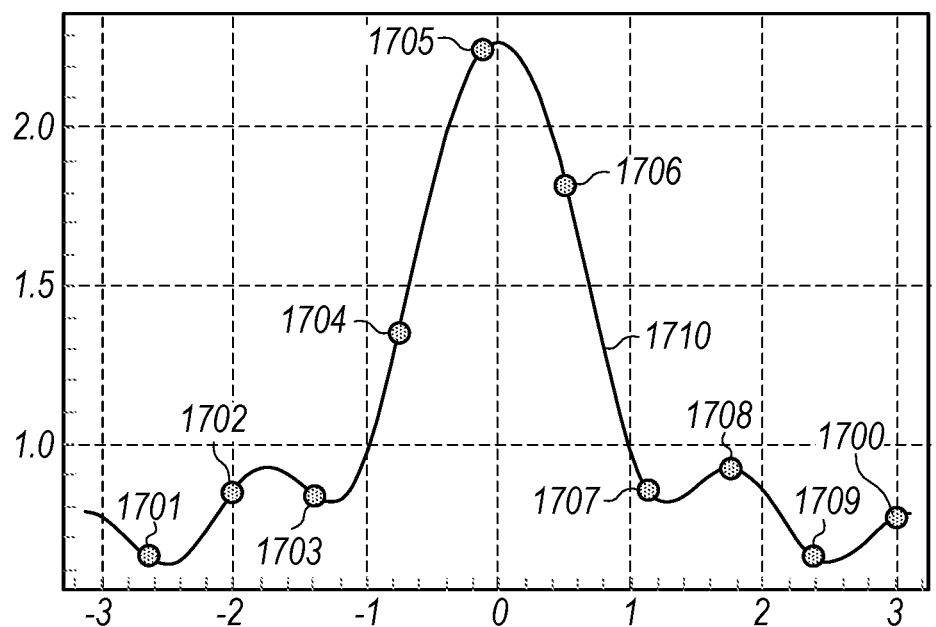
FIG. 17 illustrates a signal sampled at a first sample rate.

FIG. 17 illustrates one period length from −π to π of an analogue signal 1710 according to the expression $|\Sigma_{n=1\ldots 5} \exp(It)/n|$. Signal 1710 consists of a carrier plus its attenuated $2^{nd}$, $3^{rd}$, $4^{th}$ and $5^{th}$ harmonics. Further, FIG. 17 illustrates digital samples 1700, . . . , 1709 of the signal. Signal 1710 is ten times oversampled in the example of FIG. 17.

Figure 18:
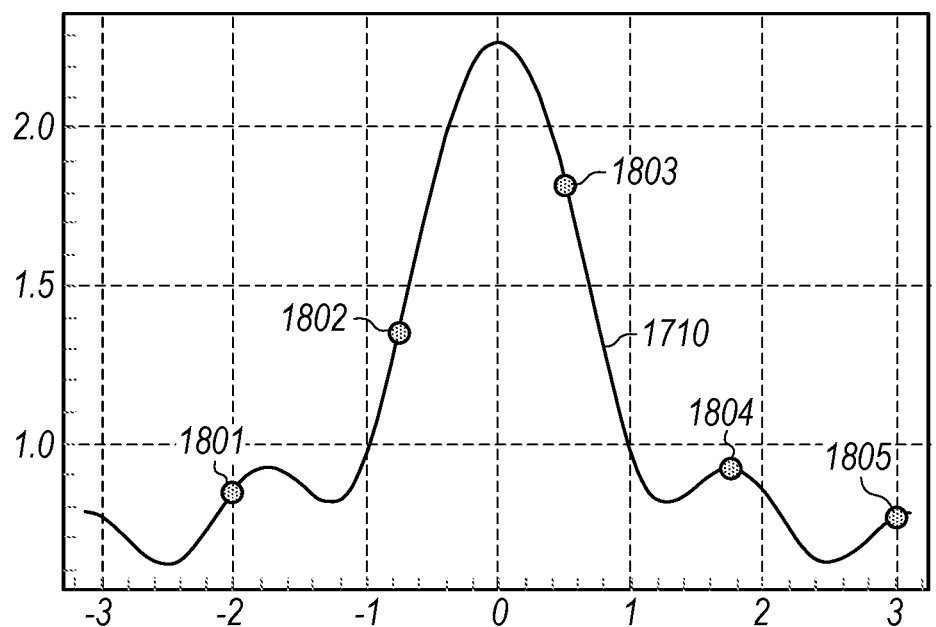
FIG. 18 illustrates a signal sampled at a second sample rate.

FIG. 18 illustrates the same signal 1710. However, in the example of FIG. 18, signal 1710 is only five time oversampled—as indicated by digital samples 1801, . . . , 1805.

Assuming that signal 1710 represents the course of a baseband signal that is to be predistorted, it is evident from FIGS. 17 and 18 that a predistortion circuit/algorithm (e.g. for Memory Digital PreDistortion, MDPD) can hardly estimate/follow the $5^{th}$ exponential order harmonic at the low sample rate. In the example of FIG. 18, the digital sample 1803 has an amplitude value of 1.8, while a subsequent power amplifier actually receives the analogue input signal with a maximum amplitude value of 2.3. Accordingly, a predistortion circuit/algorithm for MDPD will try with several weighted exponential functions to predistort the digital sample value 1.8, while the correct digital sample should be 2.3. With ten time oversampling as illustrated in FIG. 17, the error is much smaller (digital sample 1705 has an amplitude value of approx. 2.3) than for five time oversampling.

Figure 19:
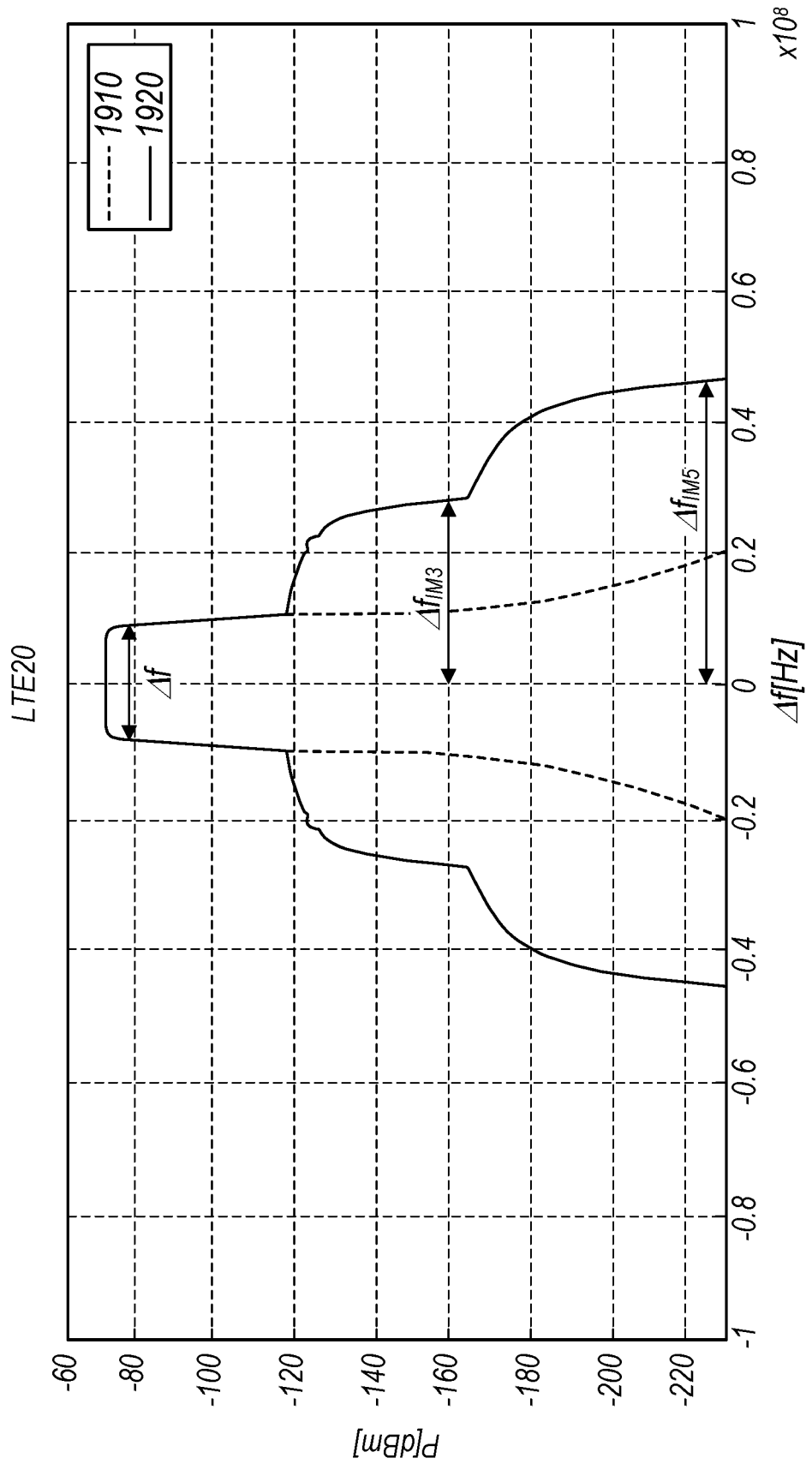
FIG. 19 illustrates a predistorted baseband signal.

An example of a baseband signal 1910 and an accordingly predistorted baseband signal 1920 is illustrated in FIG. 19. Compared to baseband signal 1910, the predistorted baseband signal 1920 comprises additional signal components relating to the $3^{rd}$ and $5^{th}$ order harmonics ($3^{rd}$ and $5^{th}$ order intermodulation distortions). Compared to the wanted signal components around the carrier frequency (around 0 MHz frequency deviation), the higher order exponential harmonics are attenuated.

Predistortion circuit 1610 of apparatus 1600 allows to track to higher order exponential harmonics since the first sample rate (i.e. the input sample rate) is high enough. Further, the second sample rate (i.e. the output sample rate) is low enough to save current and to achieve reasonable attenuation of the higher order exponential harmonics. In other words, apparatus 1600 may be understood as a novel downsampling MDPD approach. In a second step, (higher order) upsampling filter 1620 allows to restore the original MDPD input sample rate. Since the upsampling filter 1620 uses fixed coefficients and since no exponential order occurs, it is much simpler than the MDPD calculation (e.g. Volterra series). Apparatus 1600 may, hence, allow to save current.

Although the downsampling of predistortion circuit 1610 may lead to an alias of the $5^{th}$ order harmonics in the predistorted baseband signal, the adaption algorithm of upsampling filter 1620, which receives the downsampled signal as input, will optimize the addition of the aliased signal to the original signal inherently.

Figure 20:
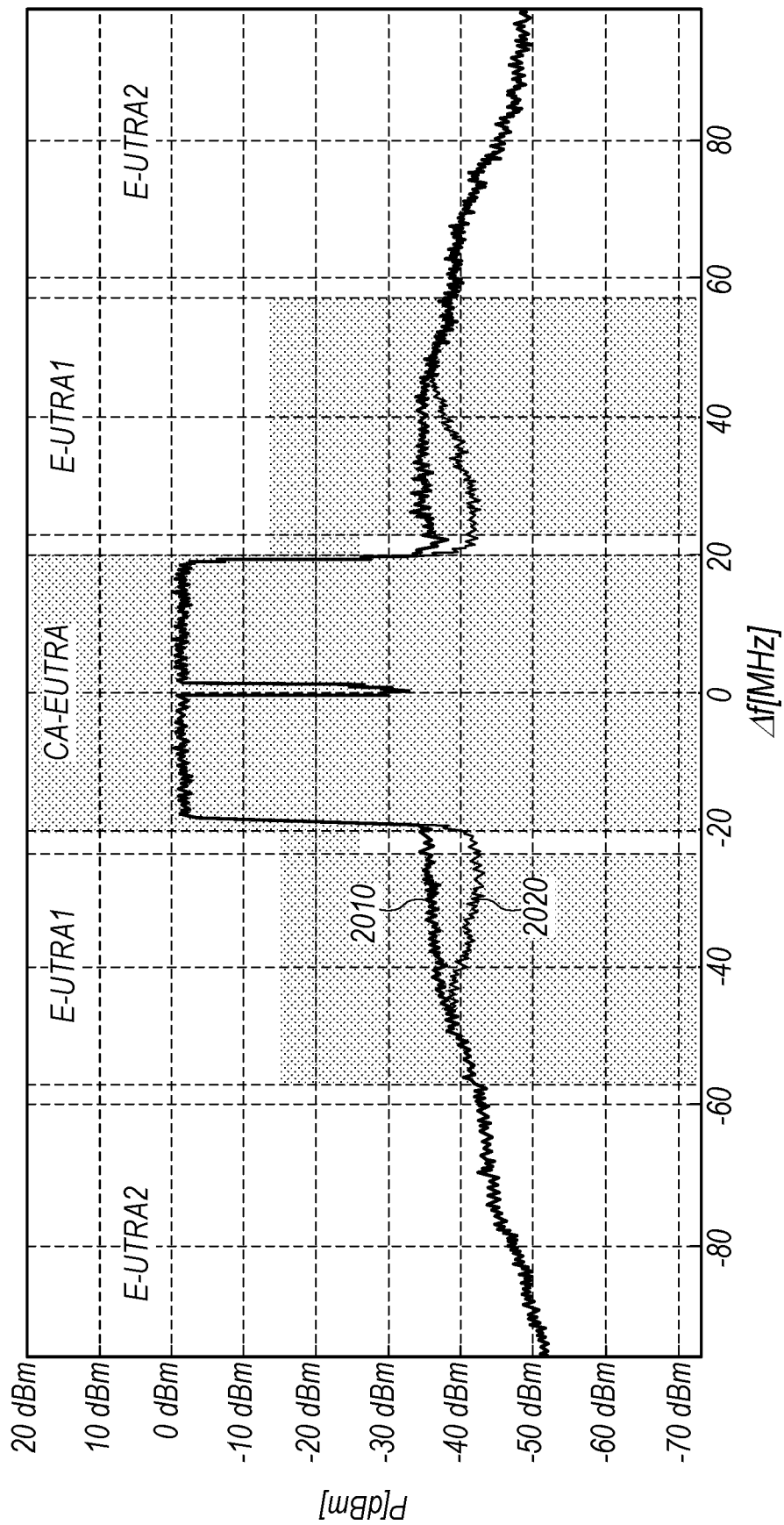
FIGS. 20 to 22 illustrate further examples of signal spectra.

The effect of predistortion as described above in conjunction with FIGS. 16 to 19 is illustrated in FIG. 20. FIG. 20 illustrates the spectra of two LTE 20 signals 2010 and 2020. Signal 2010 is generated based on a baseband signal a without predistortion, whereas signal 2020 is generated based on the same baseband signal using apparatus 1600 for MDPD.

The input signal for MDPD is a LTE carrier aggregation signal with ±19 MHz bandwidth. A Volterra based $5^{th}$ order MDPD is used for predistortion. The input sample rate of the predistortion circuit (i.e. the first sample rate) is 184 MHz, whereas the output sample rate of the predistortion circuit is 92 MHz. This sampling frequency yields to an MDPD edge of 92/2 MHz=46 MHz. By comparing signals 2010 and 2020, it is evident, that MDPD according to the proposed concept provides signal attenuation up to the Nyquist rate (i.e. half of the sample rate, which is 46 MHz in the example of FIG. 20). Accordingly, ACLR may be reduced.

Figure 21:
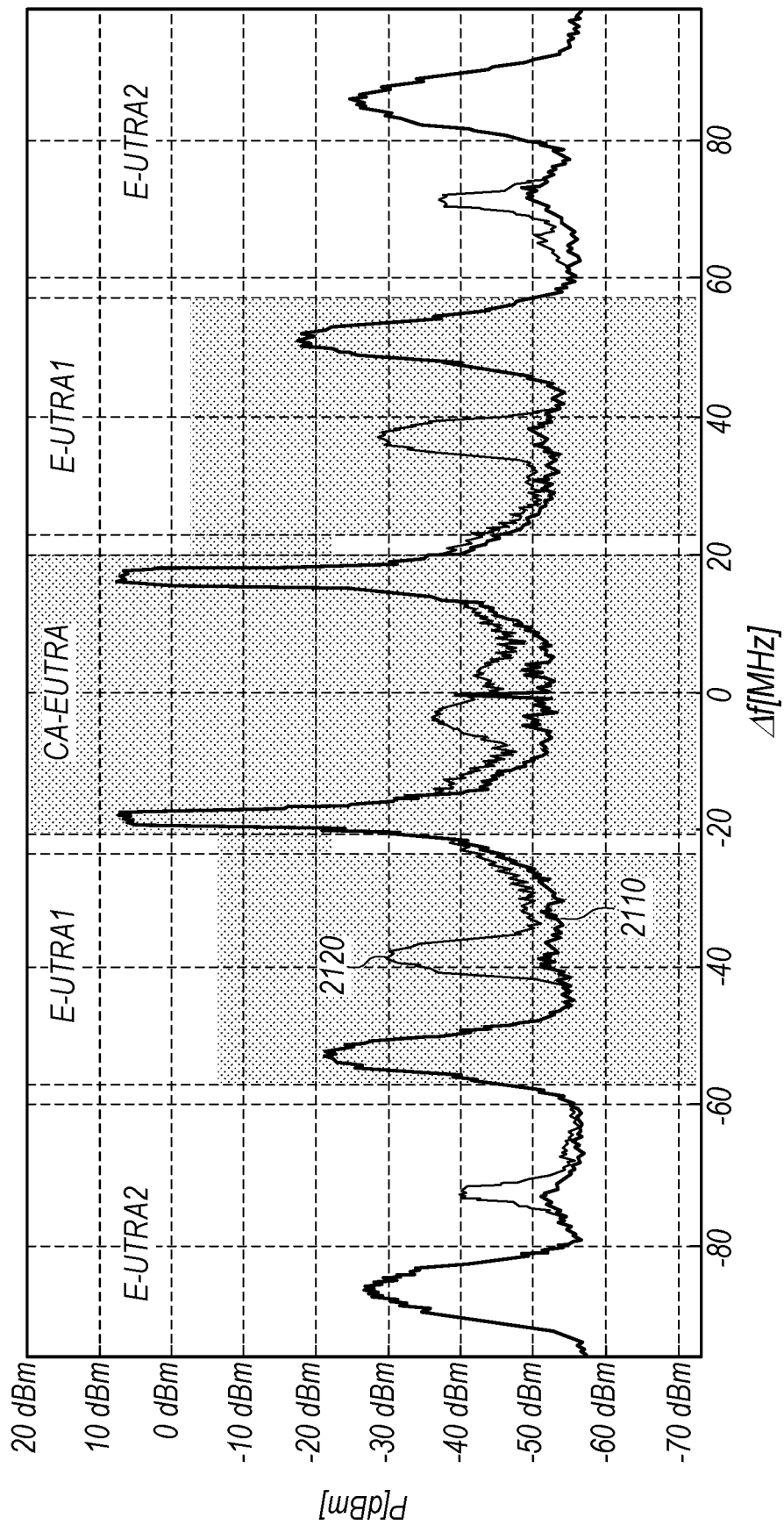

In some examples, it may however be beneficial to not reduce the sample rate. This is exemplarily illustrated in FIGS. 21 and 22. FIG. 21 illustrates the spectra of two LTE 20 signals 2110 and 2120. Signal 2110 is generated based on a baseband signal a without predistortion, whereas signal 2120 is generated based on the same baseband signal using downsampling MDPD. The input signal for MDPD is again a LTE carrier aggregation signal with ±19 MHz bandwidth. A Volterra based $5^{th}$ order MDPD is used for predistortion. As can be seen from FIG. 21, the LTE carrier aggregation signal comprises two narrowband allocated spectra that are widely separated from each other (i.e. a horn spectrum). Second aliases for the $3^{rd}$ and $5^{th}$ order harmonics are created in the LTE 20 signal 2120 due to the downsampling MDPD.

Figure 22:
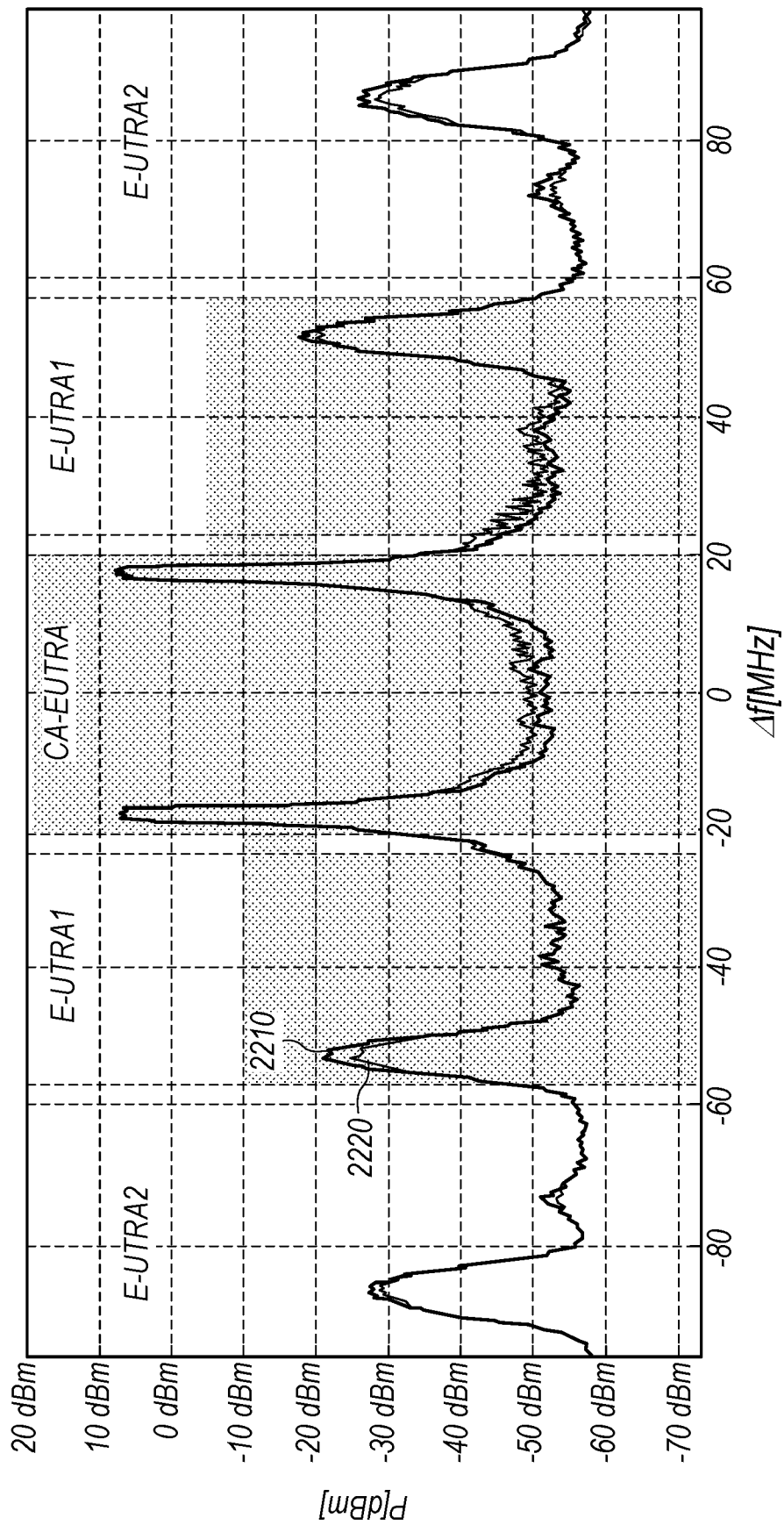

By performing the MDPD without downsampling, the creation of aliases may be avoided and the $3^{rd}$ as well as the $5^{th}$ order harmonics may be reduced. This is illustrated in FIG. 22 illustrating the spectra of two LTE 20 signals 2210 and 2220. Signal 2210 substantially corresponds to signal 2110 illustrated in FIG. 21. Signal 2220 is generated based on the same baseband signal as signal 2210 using MDPD without downsampling (i.e. normal MDPD).

Since downsampling MDPD may be adverse for certain rare spectra, apparatus 1600 may be adapted accordingly. In particular, the predistortion circuit 1610 may be further configured to receive information about a spectral allocation of the baseband signal's data in a frequency spectrum (i.e. the shape of the resulting signal spectrum; e.g. indicated by the allocated resource blocks). If the spectral allocation satisfies a first decision criterion (minimum/maximum bandwidth of allocated spectra or minimum/maximum distance between allocated spectra; e.g. spectrum as illustrated in FIG. 20), the predistortion circuit 1610 may be further configured to calculate the samples of the predistorted baseband signal at the second sample rate (i.e. the input sample rate). If the spectral allocation satisfies a second decision criterion (e.g. spectrum as illustrated in FIG. 22), the predistortion circuit 1610 may be further configured to calculate the samples of the predistorted baseband signal at the first sample rate (i.e. the lower output sample rate). Accordingly, the upsampling filter 1620 may be deactivated, if the spectral allocation satisfies the second decision criterion.

In other words, apparatus 1600 may support multirate DPD. According to the known transmit signal, the circuitry or the algorithm for predistortion may differ. For example, it may run with N multipliers in decimation mode or it may run with N/n multipliers for each polyphaser at a n-times higher sample rate. Alternatively, an improved upsampling filter which better suppresses the alias components might be used. Further alternative, MDPD might be switched off and the PA might be operated in the more linear average power tracking mode.

Figure 23:
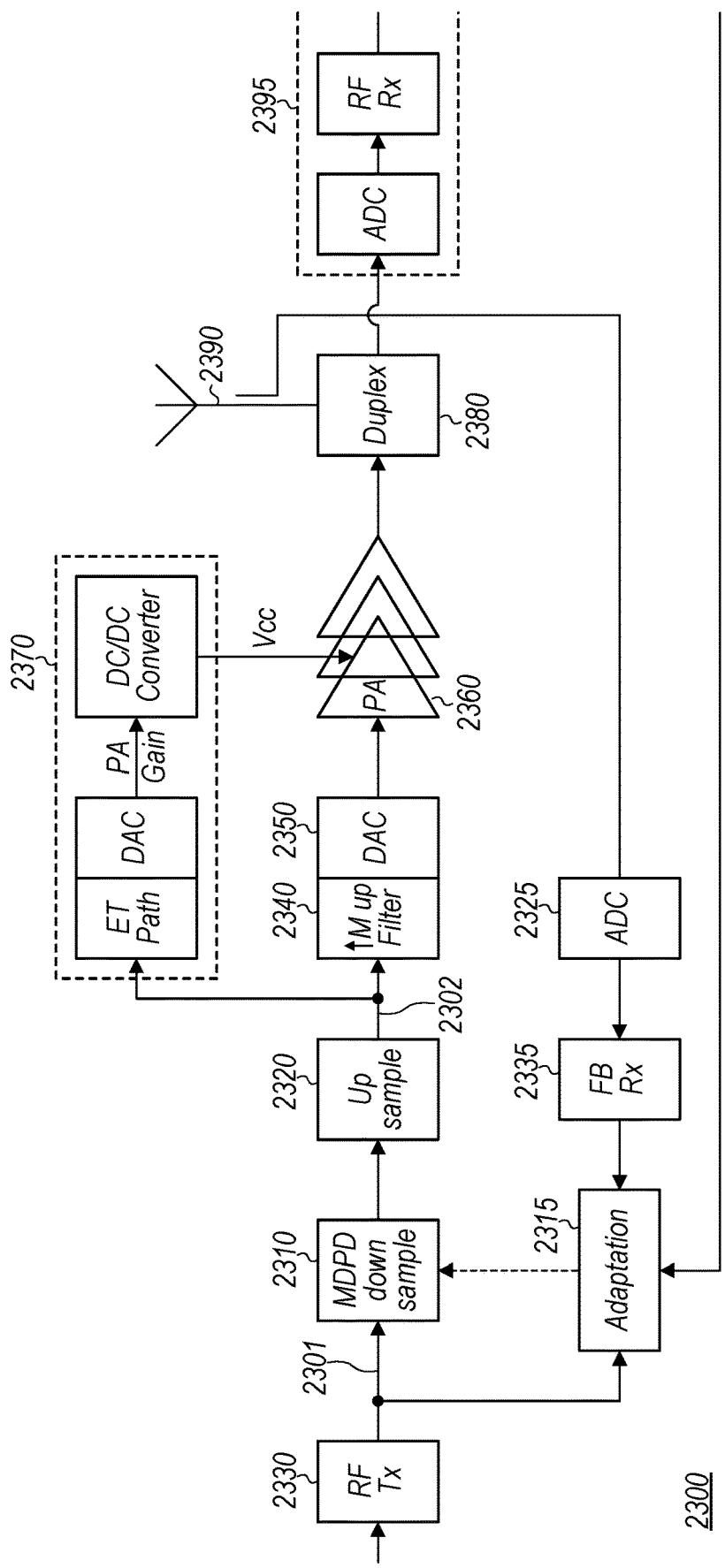
FIG. 23 illustrates an example of a wireless transceiver.

An example of a wireless transceiver 2300 using downsampling predistortion is illustrated in FIG. 23. Baseband circuitry 2330 provides a baseband signal 2301 to predistortion circuit 2310. Predistortion circuit 2310 samples baseband signal 2301 at its sample rate and outputs a predistorted baseband signal 2302 at a lower sample rate. Upsampling filter 2320 upsamples the predistorted baseband signal 2302 to the original sample rate of baseband signal 2301.

The predistorted baseband signal 2302 is then upmixed to radio frequency using upmixer 2340 and further converted to an analog representation by ADC 2350. The analog predistorted baseband signal is amplified by PA 2360 and provided to antenna 2390 via duplexer 2380.

As indicated in FIG. 23, the supply voltage $V_{cc}$ for PA 2360 is provided by an envelope tracking circuitry 2370 (comprising an envelope tracking path for determining the envelope of the predistorted baseband signal 2302, an ADC for digitalization and a DC-to-DC converter for providing $V_{cc}$ based on the digitized envelope information).

The downsampling MPDP used in wireless transceiver 2300 may allow to generate a RF signal for radiation to the environment with reduced signal distortions and with reduced power consumption.

Predistortion circuit 2310 may further support different/ multiple configurations as described above. Accordingly, wireless transceiver 2300 comprises a feedback path from antenna 2390 to adaption circuitry 2315. The feedback path receives a portion of the distorted PA output signal (e.g. by means of a coupler). The feedback signal is down-converted to the baseband domain and subsequently digitized by ADC 2325. Feedback receiver 2335 further processes the feedback signal. The adaption circuitry 2315 updates a predistortion parameter (e.g. a predistortion function) of the presently used predistorter configuration by comparing a sequence of the processed feedback signal with a time aligned sequence of baseband signal 2301 as described above. The feedback signal may alternatively or additionally be provided by the regular receive path 2395 of wireless transceiver 2300.

Figure 24:
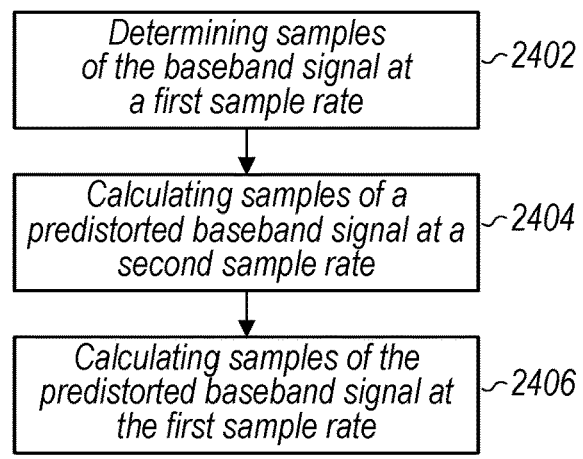
FIG. 24 illustrates a flowchart of an example of a method for predistorting a baseband signal.

In order to summarize the above aspects on downsampling MDPD, FIG. 24 further illustrates a flowchart of a method 2400 for predistorting a baseband signal. Method 2400 comprises determining 2402 samples of the baseband signal at a first sample rate. Further, method 2400 comprises calculating 2404 samples of a predistorted baseband signal at a second sample rate based on predistortion parameters and the samples of the baseband signal. The second sample rate is lower than the first sample rate. Method 2400 additionally comprises calculating 2406 samples of the predistorted baseband signal at the first sample rate based on the samples of the predistorted baseband signal at the second sample rate.

Since the input sample rate of the MDPD is high, amplitude values of the baseband signal may be tracked with high accuracy. Further, since the output sample rate of the MDPD is low, the MDPD calculates only the required output samples, which results in low current consumption. Accordingly, the MDPD achieves both high accuracy and low current consumption at the same time.

More details and aspects of the method are mentioned in connection with the proposed technique or one or more examples described above (e.g. FIGS. 16 to 23). The method may comprise one or more additional optional features corresponding to one or more aspects of the proposed technique or one or more examples described above.

Figure 25:
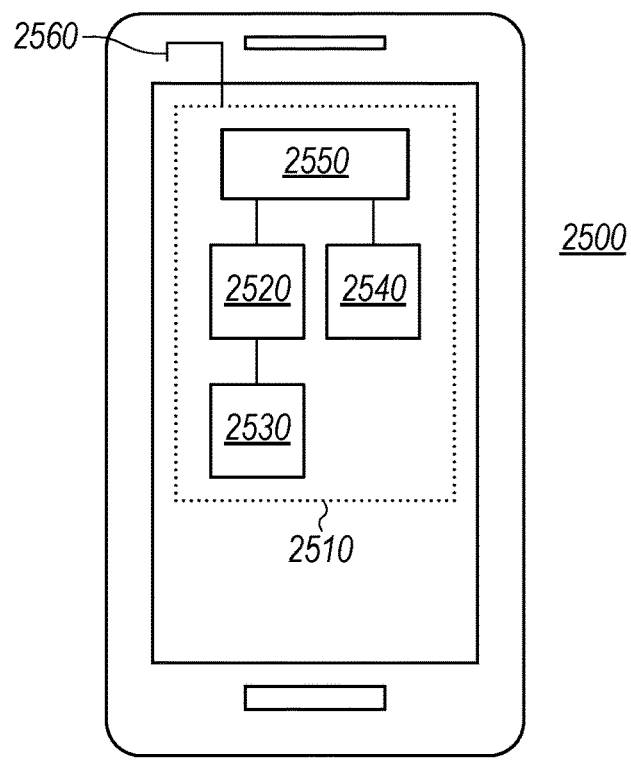
FIG. 25 illustrates an example of a mobile device using predistortion.

An example of an implementation using predistortion according to one or more aspects of the proposed technique or one or more examples described above is illustrated in FIG. 25. FIG. 25 schematically illustrates an example of a mobile device 2500 (e.g. mobile phone, smartphone, tablet-computer, or laptop).

Mobile device 2500 comprises a wireless transmitter or transmitter circuit 2510 according to one or more aspects of the proposed technique or one or more examples described above. At least one antenna 2260 of the mobile device 2500 is coupled to the wireless transmitter or transmitter circuit 2510.

The wireless transmitter or transmitter circuit 2510 may comprise a predistortion circuit 2520, a control circuit 2530 for predistortion circuit 2520 and/or an apparatus for predistorting a baseband signal 2540 according to one or more aspects of the proposed technique or one or more examples described above. Outputs of the predistortion circuit 2520 and/or the apparatus for predistorting a baseband signal 2540 may be coupled to a PA 2550 for amplifying the predistorted signals.

To this end, a mobile device enabling generation of high bandwidth transmit signals with reduced current consumption may be provided.

The above wireless communication circuits using predistortion according to the proposed technique or one or more of the examples described above may be configured to operate according to one of the $3^{rd}$ Generation Partnership Project (3GPP)-standardized mobile communication networks or systems. The mobile or wireless communication system may correspond to, for example, a 5G New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM) or Enhanced Data rates for GSM Evolution (EDGE) network, a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples as described herein may be summarized as follows:

Example 1 is a predistortion circuit for a wireless transmitter, comprising: a signal input configured to receive a baseband signal; and a predistorter configured to generate a predistorted baseband signal using the baseband signal and a select of one of a first predistorter configuration and a second predistorter configuration.

In example 2, the first predistorter configuration in the predistortion circuit of example 1 performs a first predistortion function and wherein the second predistorter configuration performs a second predistortion function.

In example 3, the predistortion circuit of example 1 or 2 further comprises: a first number of computation nodes active in the first predistorter configuration; and a second number of computation nodes active in the second predistorter configuration.

In example 4, the second number in the predistortion circuit of example 3 is higher than the first number.

In example 5, the first number of computation nodes in the predistortion circuit of example 3 are configured to operate at a first rate, wherein the second number of computation nodes are configured to operate at a second rate, and wherein the second rate is higher than the first rate.

In example 6, the predistortion circuit of example 5 further comprises a sample rate converter configured to match an output of the first number of computation nodes to the second rate to generate a rate matched output of the first number of computation nodes.

In example 7, the predistortion circuit of example 6 further comprises a combination circuit configured to combine an output of the second number of computation nodes and the rate matched output of the first number of computation nodes.

In example 8, the predistortion circuit of any of the preceding examples further comprises a configuration handling circuit configured to select the first predistorter configuration or the second predistorter configuration depending on an operating characteristic of the wireless transmitter.

In example 9, the operating characteristic in the predistortion circuit of example 8 comprises at least one of an Average Power Tracking Mode, an Envelope Tracking Mode, an output power range, a peak-to-average power ratio of the baseband signal, a modulation scheme used to generate the baseband signal, and a matching condition of an antenna.

In example 10, the operating characteristic in the predistortion circuit of example 8 or 9 comprises at least one of a transmit bandwidth, a transmit band, a transmit frequency range within the transmit band, a number of transmit clusters in a frequency domain, a frequency separation between the transmit clusters, and a bandwidth of each transmit cluster.

In example 11, the operating characteristic in the predistortion circuit of any of examples 8 to 10 comprises an acceptable spectral mask.

In example 12, the configuration handling circuit in the predistortion circuit of example 8 further comprises an input interface configured to receive a feedback signal depending on an output of a power amplifier of the transmitter, wherein the configuration handling circuit is further configured to select the first predistorter configuration or the second predistorter configuration depending on the feedback signal.

Example 13 is a predistortion circuit for a wireless transmitter, comprising: a signal input configured to receive a baseband signal; and a predistorter configured to generate a predistorted baseband signal using a first sub-circuit to calculate a first portion of a predistorted baseband signal at a first rate and a second sub-circuit to calculate a first portion of a predistorted baseband signal at a second rate.

In example 14, the predistortion circuit of example 13 further comprises rate matching circuitry configured to adjust the first rate and the second rate to a sampling rate of the predistorted baseband signal.

In example 15, the predistortion circuit of example 13 or 14 further comprises a combination circuit configured to combine the first portion of the predistorted baseband signal and the second portion of the predistorted baseband signal to generate the predistorted baseband signal.

Example 16 is a method for generating a predistorted baseband signal for a wireless transmitter, comprising: selecting a first predistorter configuration or a second predistorter configuration; and generating the predistorted baseband signal using a baseband signal and the select predistorter configuration.

In example 17, the method of example 16 further comprises: performing a first predistortion function in the first predistorter configuration; and performing a second predistortion function in the second predistorter configuration.

In example 18, the method of example 16 or 17 further comprises: using a first number of computations in the first predistorter configuration; and using a second number of computations in the second predistorter configuration.

In example 19, the second number is higher than the first number in the method of example 18.

In example 20, the method of example 18 further comprises: performing the first number of computations at a first rate; and performing the second number of computations at a second rate, the first rate being higher than the second rate.

In example 21, the method of example 18 further comprises matching an output of the first number of computations to the second rate to generate a rate matched output of the first number of computation nodes.

In example 22, the method of example 21 further comprises combining an output of the second number of computations with the rate matched output of the first number of computations.

In example 23, the method of any of examples 16 to 22 further comprises selecting the first predistorter configuration or the second predistorter configuration depending on an operating characteristic of the wireless transmitter.

In example 24, the operating characteristic in the method of example 23 comprises at least one of an Average Power Tracking Mode, an Envelope Tracking Mode, an output power range, a peak-to-average power ratio of the baseband signal, a modulation scheme used to generate the baseband signal, and a matching condition of an antenna.

In example 25, the operating characteristic in the method of example 23 or 24 comprises at least one of a transmit bandwidth, a transmit band, a transmit frequency range within the transmit band, a number of transmit clusters in a frequency domain, a frequency separation between the transmit clusters, and a bandwidth of each transmit cluster.

In example 26, the operating characteristic in the method of any of examples 23 to 25 comprises an acceptable spectral mask.

In example 27, the method of any of examples 16 to 26 further comprises: receiving a feedback signal depending on an output of a power amplifier of the transmitter; and selecting the first predistorter configuration or the second predistorter configuration depending on the feedback signal.

Example 28 is a wireless transmitter comprising a predistortion circuit according to any one of examples 1 to 15.

In example 29, the wireless transmitter of example 28 further comprises a power amplifier coupled to an output of the predistortion circuit.

Example 30 is a mobile device comprising a wireless transmitter according to one of examples 28 or 29.

In example 31, the mobile device of example 30 further comprises at least one antenna coupled to the wireless transmitter.

Example 32 is a non-transitory computer readable medium having stored thereon a program having a program code for performing the method of any of examples 16 to 27, when the program is executed on a computer or processor.

Example 33 is a computer program having a program code configured to perform the method of any of examples 16 to 27, when the computer program is executed on a computer or processor.

Example 34 is a control circuit for a predistortion circuit, the control circuit comprising: a feedback signal input configured to receive a feedback signal related to an output of a power amplifier; bandwidth limitation circuitry configured to limit a bandwidth of the feedback signal to derive a bandlimited feedback signal; and a parameter handling circuit configured to update predistortion parameters used within the predistortion circuit based on the bandlimited feedback signal.

In example 35, the control circuit of example 34 further comprises an output interface configured to output the updated predistortion parameters.

In example 36, the bandwidth limitation circuitry in the control circuit of example 34 or 35 comprises: an adjustable mixer configured to downmix the feedback signal using a feedback oscillator signal to generate a downmixed feedback signal, the feedback oscillator signal having a frequency of a local oscillator signal plus an observation frequency offset; and a band pass filter circuit configured to band filter the downmixed feedback signal to generate the bandlimited feedback signal.

In example 37, the control circuit of any of examples 34 to 36 further comprises a reference signal generation circuit comprising: a reference signal input configured to receive a reference signal related to an output of the predistortion circuit or related to an input of the predistortion circuit; and further bandwidth limitation circuitry configured to limit a bandwidth of the reference signal to derive a bandlimited reference signal, wherein the configuration handling circuit is configured to update the predistortion parameters based on the bandlimited observation signal and the bandlimited reference signal.

In example 38, the further bandwidth limitation circuitry in the control circuit of example 37 comprises: a frequency shifter configured to shift the reference signal by a frequency offset; and a further band pass filter circuit configured to band filter the shifted reference signal to generate the bandlimited feedback signal.

In example 39, the frequency offset in the control circuit of example 38 corresponds to an observation frequency offset of a feedback signal.

Example 40 is a transmitter circuit, comprising: a predistortion circuit configured to receive a baseband signal and to generate a predistorted baseband signal based on predistortion parameters; an upmixer configured to generate a radio frequency signal using the predistorted baseband signal and a local oscillator signal; a power amplifier coupled to an output of the upmixer and configured to generate an amplified radio frequency signal; and a control circuit for the predistortion circuit, the control circuit comprising: a feedback signal input configured to receive a feedback signal related to an output of a power amplifier; bandwidth limitation circuitry configured to limit a bandwidth of the feedback signal to derive a bandlimited feedback signal; a reference signal input configured to a receive reference signal related to an output of the predistortion circuit or related to an input of the predistortion circuit; further bandwidth limitation circuitry configured to limit a bandwidth of the reference signal to derive a bandlimited reference signal; and a parameter handling circuit configured to update the predistortion parameters used within the predistortion circuit based on the bandlimited feedback signal and on the bandlimited reference signal.

In example 41, the bandwidth of the bandlimited feedback signal and of the bandlimited reference signal are equal in the transmitter circuit of example 40.

In example 42, the control circuit in the transmitter circuit of example 40 or 41 further comprises a phase control input coupled to an output of the upmixer to receive a phase control signal, wherein the control circuit is further configured to adjust a phase of the feedback signal based on the phase control signal.

In example 43, the bandwidth limitation circuitry in the transmitter circuit of any of examples 40 to 42 further comprises an adjustable mixer configured to downmix the feedback signal using a feedback oscillator signal, the feedback oscillator signal having an observation frequency offset from the frequency of the local oscillator signal; and the further bandwidth limitation circuitry comprises a frequency shifter configured to shift the reference signal by the inverse of the observation frequency offset.

Example 44 is a mobile device comprising a transmitter circuit according to one of examples 40 to 43.

In example 40, the mobile device of example 40 further comprises at least one antenna coupled to the transmitter circuit.

Example 46 is a method to determine parameters for a predistortion circuit, the method comprising: receiving a feedback signal related to an output of a power amplifier; limiting a bandwidth of the feedback signal to derive a bandlimited feedback signal; and updating predistortion parameters used within the predistortion circuit based on the bandlimited feedback signal.

In example 47, the method of example 46 further comprises: downmixing the feedback signal to generate a downmixed feedback signal using a feedback oscillator signal to generate a downmixed feedback signal, the feedback oscillator signal having a frequency of a local oscillator signal plus an observation frequency offset; and band pass filtering the downmixed feedback signal.

In example 48, the method of example 46 or 47 further comprises: receiving a reference signal related to related to an output of the predistortion circuit or related to an input of the predistortion circuit; limiting a bandwidth of the reference signal to derive a bandlimited reference signal; and updating the predistortion parameters based on the bandlimited observation signal and the bandlimited reference signal.

In example 49, the method of any of examples 46 to 48 further comprises shifting the reference signal by a frequency offset.

In example 50, the frequency offset in the method of example 49 corresponds to an observation frequency offset of a feedback signal.

Example 51 is a non-transitory computer readable medium having stored thereon a program having a program code for performing the method of any of examples 46 to 50, when the program is executed on a computer or processor.

Example 52 is a computer program having a program code configured to perform the method of any of examples 46 to 50, when the computer program is executed on a computer or processor.

Example 53 is an apparatus for predistorting a baseband signal, comprising: a predistortion circuit configured to determine samples of the baseband signal at a first sample rate and calculate samples of a predistorted baseband signal at a second sample rate based on predistortion parameters and the samples of the baseband signal, wherein the second sample rate is lower than the first sample rate; and an upsampling filter configured to calculate samples of the predistorted baseband signal at the first sample rate based on the samples of the predistorted baseband signal at the second sample rate.

In example 54, the first sample rate in the apparatus of example 53 is equal to or higher than a sample rate of the baseband signal.

In example 55, the predistortion circuit in the apparatus of example 53 or example 54 is further configured to: receive information about a spectral allocation of the baseband signal's data in a frequency spectrum; calculate the samples of the predistorted baseband signal at the second sample rate, if the spectral allocation satisfies a first decision criterion; and calculate the samples of the predistorted baseband signal at the first sample rate, if the spectral allocation satisfies a second decision criterion.

In example 56, the upsampling filter in the apparatus of example 55 is deactivated, if the spectral allocation satisfies the second decision criterion.

Example 57 is a wireless transmitter comprising an apparatus for predistorting a baseband signal according to any one of examples 53 to 56.

In example 58, the wireless transmitter of example 57 further comprises a power amplifier coupled to an output of the apparatus for predistorting a baseband signal.

Example 59 is a mobile device comprising a wireless transmitter according to examples 57 or example 58.

In example 60, the mobile device of example 59 further comprises at least one antenna coupled to the wireless transmitter.

Example 61 is a method for predistorting a baseband signal, comprising: determining samples of the baseband signal at a first sample rate; calculating samples of a predistorted baseband signal at a second sample rate based on predistortion parameters and the samples of the baseband signal, wherein the second sample rate is lower than the first sample rate; and calculating samples of the predistorted baseband signal at the first sample rate based on the samples of the predistorted baseband signal at the second sample rate.

In example 62, the first sample rate in the method of example 61 is equal to or higher than a sample rate of the baseband signal.

In example 63, the method of example 61 or example 62 further comprises: receiving information about a spectral allocation of the baseband signal's data in a frequency spectrum, wherein the samples of the predistorted baseband signal are calculated at the second sample rate, if the spectral allocation satisfies a first decision criterion; and calculating the samples of the predistorted baseband signal at the first sample rate, if the spectral allocation satisfies a second decision criterion.

In example 64, an upsampling filter is used in the method of example 63 for calculating the samples of the predistorted baseband signal at the first sample rate based on the samples of the predistorted baseband signal at the second sample rate, wherein the method further comprises deactivating the upsampling filter, if the spectral allocation satisfies the second decision criterion.

Example 65 is a non-transitory computer readable medium having stored thereon a program having a program code for performing the method of any of examples 61 to 64, when the program is executed on a computer or processor.

Example 66 is a computer program having a program code configured to perform the method of any of examples 61 to 64, when the program is executed on a computer or processor.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for pedagogical purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A predistortion circuit for a wireless transmitter, the predistortion circuit comprising:
    a signal input configured to receive a baseband signal; and
    a predistorter comprising a plurality of predistortion sub-circuits, each predistortion sub-circuit configured to perform corresponding predistortion computations, the predistorter configured to generate a predistorted baseband signal using the baseband signal and a predistorter configuration, wherein the predistorter configuration is selected from among a first predistorter configuration and a second predistorter configuration by selectively activating a corresponding unique combination of predistortion sub-circuits based at least on which one of an Average Power Tracking Mode and an Envelope Tracking mode is a current operating mode of a power amplifier of the wireless transmitter.

2. The predistortion circuit of claim 1, wherein the first predistorter configuration performs a first predistortion function and wherein the second predistorter configuration performs a second predistortion function.

3. The predistortion circuit of claim 1, wherein:
a first number of predistortion sub-circuits are active in the first predistorter configuration; and
a second number of predistortion sub-circuits are active in the second predistorter configuration.

4. The predistortion circuit of claim 3, wherein the second number is higher than the first number.

5. The predistortion circuit of claim 3, wherein:
the first number of predistortion sub-circuits are configured to operate at a first rate;
the second number of predistortion sub-circuits are configured to operate at a second rate; and
the second rate is higher than the first rate.

6. The predistortion circuit of claim 5, further comprising:
a sample rate converter configured to match an output of the first number of predistortion sub-circuits to the second rate to generate a rate matched output of the first number of predistortion sub-circuits.

7. The predistortion circuit of claim 6, further comprising:
a combination circuit configured to combine an output of the second number of predistortion sub-circuits and the rate matched output of the first number of predistortion sub-circuits.

8. The predistortion circuit of claim 1, further comprising:
a configuration handling circuit configured to select the predistorter configuration further based on an operating characteristic of the wireless transmitter.

9. The predistortion circuit of claim 8, wherein the operating characteristic comprises at least one of an output power range, a peak-to-average power ratio of the baseband signal, a modulation scheme used to generate the baseband signal, or a matching condition of an antenna.

10. The predistortion circuit of claim 8, wherein the operating characteristic comprises at least one of a transmit bandwidth, a transmit band, a transmit frequency range within the transmit band, a number of transmit clusters in a frequency domain, a frequency separation between the transmit clusters, or a bandwidth of each transmit cluster.

11. The predistortion circuit of claim 8, wherein the operating characteristic comprises an acceptable spectral mask.

12. The predistortion circuit of claim 8, wherein the configuration handling circuit further comprises:
an input interface configured to receive a feedback signal depending on an output of the power amplifier, wherein the configuration handling circuit is further configured to select the predistorter configuration further based on the feedback signal.

13. A method for generating a predistorted baseband signal for a wireless transmitter, the method comprising:
selecting a predistorter configuration from among a first predistorter configuration and a second predistorter configuration by selectively activating a corresponding unique combination of predistortion sub-circuits from a plurality of predistortion sub-circuits based at least on which one of an Average Power Tracking Mode and an Envelope Tracking mode is a current operating mode of a power amplifier of the wireless transmitter, wherein each predistortion sub-circuit performs corresponding predistortion computations; and
generating the predistorted baseband signal using a baseband signal and the selected predistorter configuration.

14. The method of claim 13, further comprising:
performing a first predistortion function in the first predistorter configuration; and
performing a second predistortion function in the second predistorter configuration.

15. The method of claim 13, further comprising:
using a first number of predistortion sub-circuits in the first predistorter configuration; and
using a second number of predistortion sub-circuits in the second predistorter configuration.

16. The method of claim 15, further comprising:
operating the first number of predistortion sub-circuits at a first rate; and
operating the second number of predistortion sub-circuits at a second rate;
wherein the first rate is higher than the second rate.

17. The method of claim 16, further comprising:
matching an output of the first number of predistortion sub-circuits to the second rate to generate a rate matched output of the first number of predistortion sub-circuits.

18. The method of claim 17, further comprising:
combining an output of the second number of predistortion sub-circuits and the rate matched output of the first number of predistortion sub-circuits.

19. The method of claim 15, wherein the second number is higher than the first number.

20. The method of claim 13, further comprising:
selecting the predistorter configuration further based on an operating characteristic of the wireless transmitter.

* * * * *